US012356705B2

(12) United States Patent
Breil et al.

(10) Patent No.: US 12,356,705 B2
(45) Date of Patent: Jul. 8, 2025

(54) ELECTRICAL CONTACT CAVITY STRUCTURE AND METHODS OF FORMING THE SAME

(71) Applicant: Applied Materials, Inc., Santa Clara, CA (US)

(72) Inventors: Nicolas Louis Breil, San Jose, CA (US); Lisa McGill, Hillsboro, OR (US); Manoj Vellaikal, Sunnyvale, CA (US); Bocheng Cao, Sunnyvale, CA (US); Pei Liu, Rexford, NY (US); Avgerinos V. Gelatos, Scotts Valley, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 18/887,821

(22) Filed: Sep. 17, 2024

(65) Prior Publication Data

US 2025/0151374 A1  May 8, 2025

Related U.S. Application Data

(60) Provisional application No. 63/661,034, filed on Jun. 17, 2024, provisional application No. 63/547,679, filed on Nov. 7, 2023.

(51) Int. Cl.
H10D 30/01 (2025.01)
H01L 23/66 (2006.01)
(Continued)

(52) U.S. Cl.
CPC ........... H10D 84/038 (2025.01); H01L 23/66 (2013.01); H10D 30/014 (2025.01);
(Continued)

(58) Field of Classification Search
CPC ............ H01L 21/823807; H01L 23/66; H01L 27/092; H01L 29/0673; H01L 29/42392; H01L 29/66439
(Continued)

(56) References Cited

U.S. PATENT DOCUMENTS 7,045,407 B2   5/2006  Keating et al.
7,262,116 B2   8/2007  Singh et al.
(Continued)

FOREIGN PATENT DOCUMENTS

WO   2008121855 A1   10/2008
WO   2017052617 A1    3/2017

OTHER PUBLICATIONS

International Search Report and Written Opinion dated Jan. 15, 2025 for Application No. PCT/US2024/048837.
(Continued)

*Primary Examiner* — Tong-Ho Kim
(74) *Attorney, Agent, or Firm* — Patterson + Sheridan, LLP

(57) ABSTRACT

A method of forming an electrical contact in a semiconductor structure includes performing a cavity shaping process on a semiconductor structures having an n-type metal oxide semiconductor (n-MOS) region and/or a p-type MOS (p-MOS) region, the cavity shaping process comprising forming an n-MOS cavity in an exposed surface of the n-MOS region and/or a p-MOS cavity in an exposed surface of the p-MOS region, wherein the cavity shaping process is configured to increase the surface area of the exposed surface of the n-MOS region or the p-MOS region. In some embodiments, the method includes performing a first selective deposition process to form a p-MOS cavity contact, selectively in the p-MOS cavity.

26 Claims, 17 Drawing Sheets

(51) Int. Cl.
*H10D 30/67* (2025.01)
*H10D 62/10* (2025.01)
*H10D 84/01* (2025.01)
*H10D 84/03* (2025.01)
*H10D 84/85* (2025.01)

(52) U.S. Cl.
CPC ....... *H10D 30/6735* (2025.01); *H10D 62/121* (2025.01); *H10D 84/0167* (2025.01); *H10D 84/85* (2025.01)

(58) Field of Classification Search
USPC .......................................................... 438/478
See application file for complete search history.

(56) References Cited

U.S. PATENT DOCUMENTS

| | | |
|---|---|---|
| 7,303,999 B1 | 12/2007 | Sriraman et al. |
| 7,396,743 B2 | 7/2008 | Singh et al. |
| 7,691,752 B2 | 4/2010 | Ranade et al. |
| 7,858,517 B2 | 12/2010 | Sato et al. |
| 7,964,910 B2 | 6/2011 | Dyer |
| 8,450,194 B2 | 5/2013 | Waite et al. |
| 8,901,537 B2 | 12/2014 | Murthy et al. |
| 9,059,024 B2 | 6/2015 | Glass et al. |
| 9,683,308 B2 | 6/2017 | Olsen et al. |
| 9,685,535 B1 | 6/2017 | Cheng et al. |
| 9,735,009 B2 | 8/2017 | Zheng et al. |
| 9,859,424 B2 | 1/2018 | Glass et al. |
| 9,870,921 B2 | 1/2018 | Olsen et al. |
| 10,141,442 B2 | 11/2018 | Bohr et al. |
| 10,199,221 B2 | 2/2019 | Olsen et al. |
| 10,896,963 B2 | 1/2021 | Mehandru et al. |
| 11,087,979 B2 | 8/2021 | Olsen et al. |
| 11,935,887 B2 | 3/2024 | Keech et al. |
| 11,965,241 B2 | 4/2024 | Chopra et al. |
| 2009/0101942 A1 | 4/2009 | Dyer |
| 2009/0170331 A1 | 7/2009 | Cheng et al. |
| 2010/0129974 A1 | 5/2010 | Futase et al. |
| 2013/0001698 A1 | 1/2013 | Waite et al. |
| 2015/0380526 A1 | 12/2015 | Godet et al. |
| 2016/0042963 A1 | 2/2016 | Kim et al. |
| 2016/0181117 A1 | 6/2016 | Arghavani et al. |
| 2017/0084456 A1 | 3/2017 | Olsen et al. |
| 2017/0098547 A1 | 4/2017 | Kim et al. |
| 2018/0033621 A1 | 2/2018 | Bao et al. |
| 2018/0033872 A1 | 2/2018 | Bao et al. |
| 2018/0138038 A1 | 5/2018 | Olsen et al. |
| 2018/0151732 A1* | 5/2018 | Mehandru ......... H01L 29/78696 |
| 2019/0067451 A1* | 2/2019 | Ching ............... H01L 29/66621 |
| 2019/0172712 A1 | 6/2019 | Olsen et al. |
| 2019/0371898 A1* | 12/2019 | Huang .............. H01L 21/76843 |
| 2020/0105619 A1* | 4/2020 | Lin ..................... H01L 29/0649 |
| 2020/0135900 A1* | 4/2020 | Lee .................... H01L 21/67069 |
| 2020/0243655 A1 | 7/2020 | Rami et al. |
| 2020/0312842 A1 | 10/2020 | Keech et al. |
| 2020/0343351 A1 | 10/2020 | Huang |
| 2021/0273080 A1* | 9/2021 | Lin ..................... H01L 29/0847 |
| 2022/0059432 A1 | 2/2022 | Iizuka et al. |
| 2022/0199804 A1 | 6/2022 | Colombeau et al. |
| 2022/0399193 A1* | 12/2022 | Cui .................. H01J 37/32146 |
| 2023/0036426 A1 | 2/2023 | Dube et al. |
| 2023/0050300 A1 | 2/2023 | Lin et al. |
| 2023/0067715 A1* | 3/2023 | Yuh .................. H01L 21/76898 |
| 2023/0197716 A1 | 6/2023 | Bomberger et al. |
| 2023/0207313 A1* | 6/2023 | Chen ................. H01L 21/02532 |
| | | 257/76 |

OTHER PUBLICATIONS

N. Breil et al., "Contact Cavity Shaping and Selective SiGe:B Low-Temperature Epitaxy Process Solution for sub 10-9 Ω.cm2 Contact Resistivity in Nonplanar FETs" 2023 IEEE Symposium on VLSI Technology and Circuits (VLSI Technology and Circuits), Kyoto, Japan, 2023, pp. 1-2.

* cited by examiner

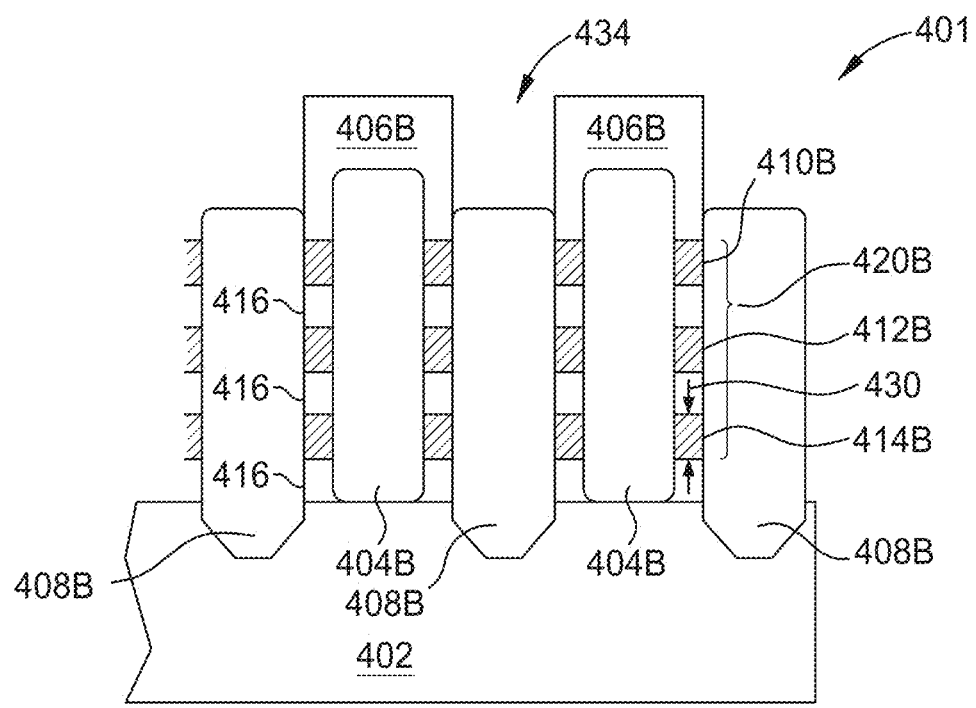
FIG. 4B
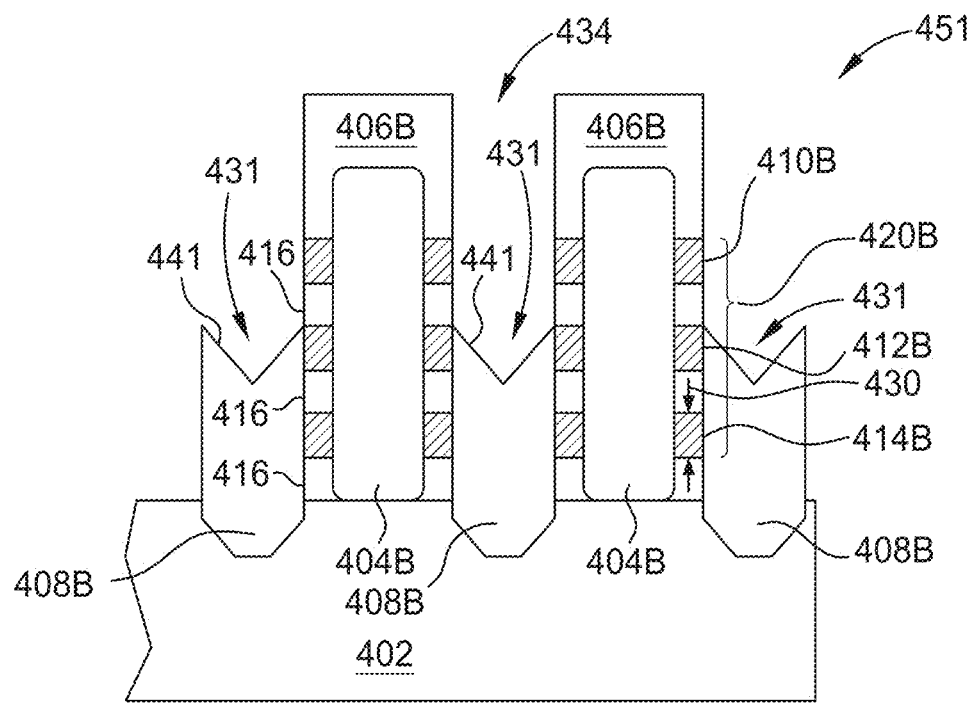
FIG. 4C1

FIG. 4C2

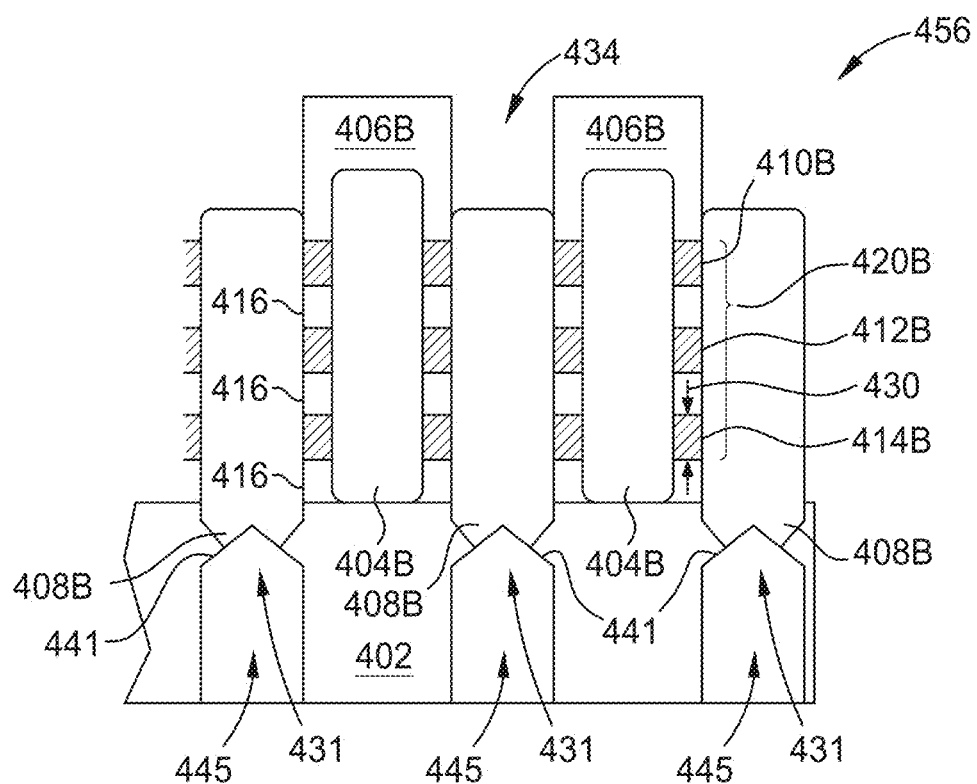
FIG. 4G1
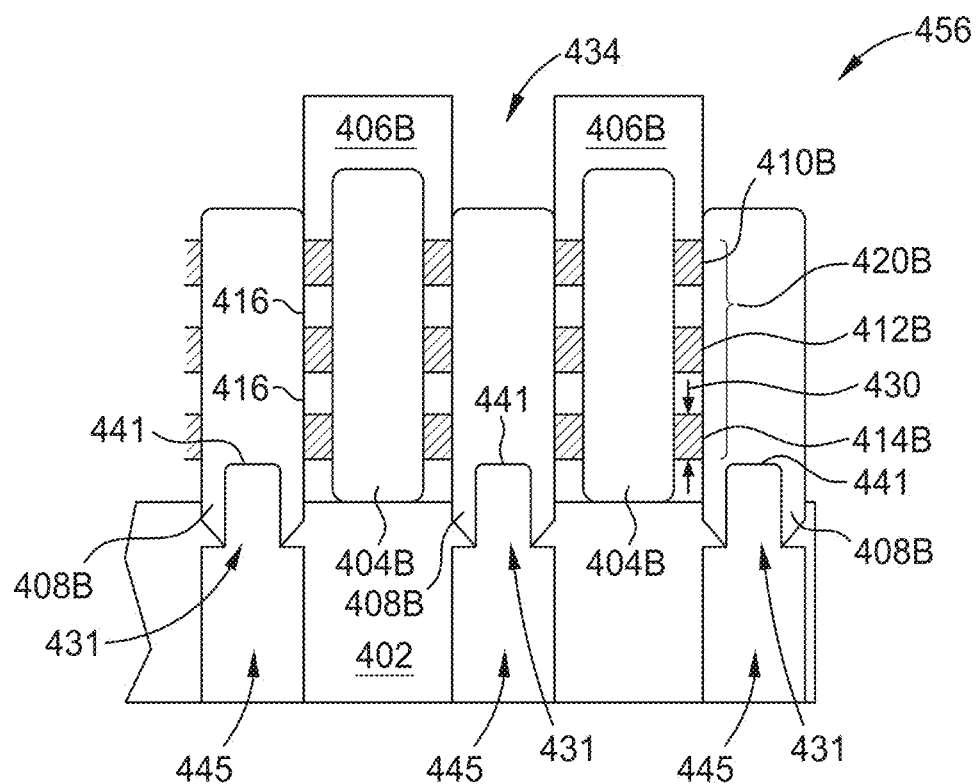
FIG. 4G2

ELECTRICAL CONTACT CAVITY STRUCTURE AND METHODS OF FORMING THE SAME

CROSS-REFERENCE TO RELATED APPLICATIONS

This application claims the benefit of U.S. provisional patent application Ser. No. 63/547,679, filed Nov. 7, 2023, and the benefit of U.S. provisional patent application Ser. No. 63/661,034, filed Jun. 17, 2024, which are both herein incorporated by reference.

BACKGROUND

Field

Embodiments described herein generally relate to semiconductor device fabrication, and more particularly, to systems and methods of forming electrical contacts within a semiconductor device structure.

Description of the Related Art

Transistors are fundamental device elements of modern digital processors and memory devices, and have found applications in high-power electronics. Currently, there are a variety of transistor designs or types that may be used for different applications. Various transistor types include, for example, bipolar junction transistors (BJT), junction field-effect transistors (JFET), metal-oxide-semiconductor field-effect transistors (MOS FET), vertical channel or trench field-effect transistors, and superjunction or multi-drain transistors. One or more of these types of transistors can be useful in both logic and memory applications.

A key challenge in semiconductor design, manufacture, and operation is contact resistance. Contact resistance is becoming a significant proportion of the overall device resistance due to scaling trends in 3D semiconductor devices. Multi-gate metal-oxide-semiconductor field-effect transistors (MOS FETs) pose challenges in manufacturability due to their three-dimensional (3D) designs and small sizes. For example, during design and manufacture or forming of, metal oxide semiconductor (MOS) transistor semiconductor devices, such as those used in a complementary metal oxide semiconductor (CMOS), it is often desired to minimize contact resistance. Contacts that include a high contact resistance will have a decreased device performance. Increasing device performance of circuit containing devices including transistors, diodes, resistors, capacitors, and other passive and active electronic devices formed on a semiconductor substrate is typically a major factor considered during design, manufacture, and operation of those devices.

Therefore, there is a need for devices that include contacts with a decreased contact resistance and methods of forming the same.

SUMMARY

Embodiments of the present disclosure provide a method of forming an electrical contact in a semiconductor structure. The method includes performing a cavity shaping process on a semiconductor structure having an n-type metal oxide semiconductor (n-MOS) region and a p-type MOS (p-MOS) region, the cavity shaping process comprising forming an n-MOS cavity in an exposed surface of the n-MOS region and a p-MOS cavity in an exposed surface of the p-MOS region, and performing a first selective deposition process to form a p-MOS cavity contact, selectively in the p-MOS cavity.

The cavity shaping process can include forming an n-MOS cavity in an exposed surface of the n-MOS region, performing a deposition process to form an n-MOS cavity contact, and then forming a p-MOS cavity in an exposed surface of the p-MOS region and then performing a deposition process to form a p-MOS cavity contact. The cavity shaping process can alternately include forming a p-MOS cavity in an exposed surface of the p-MOS region and then performing a deposition process to form a p-MOS cavity contact and then forming an n-MOS cavity in an exposed surface of the n-MOS region and then performing a deposition process to form an n-MOS cavity contact.

Embodiments of the present disclosure also provide a method of forming an electrical contact in a semiconductor structure. The method includes performing a pre-clean process on a semiconductor structure having an n-type metal oxide semiconductor (n-MOS) region, a p-type metal oxide semiconductor (p-MOS) region, and a dielectric layer having a first trench over the n-MOS region and a second trench over the p-MOS region, performing a cavity shaping process to form an n-MOS cavity in an exposed surface of the n-MOS region within the first trench and a p-MOS cavity in an exposed surface of the p-MOS region within the second trench, performing a first selective deposition process to form a p-MOS cavity contact, selectively in the p-MOS cavity, performing a second selective deposition process to form an n-MOS cavity contact, selectively in the n-MOS cavity, performing a blanket deposition process to form a barrier layer on exposed inner surfaces of the first trench and the second trench and on the exposed surface of the dielectric layer, and performing a metal fill process to form a first contact plug in the first trench and a second contact plug in the second trench.

Embodiments of the present disclosure further provide a processing system. The processing system includes a first processing chamber, a second processing chamber, and a system controller configured to cause the processing system to perform, in the first processing chamber, a cavity shaping process on a semiconductor structures having an n-type metal oxide semiconductor (n-MOS) region and a p-type metal oxide semiconductor (p-MOS) region, the cavity shaping process comprising forming an n-MOS cavity in an exposed surface of the n-MOS region and a p-MOS cavity in an exposed surface of the p-MOS region, and perform, in the second processing chamber, a first selective deposition process to form a p-MOS cavity contact, selectively in the p-MOS cavity.

Embodiments of the present disclosure may further provide a method of forming an electrical contact within a semiconductor device, comprising: forming a contact cavity within a semiconductor material region of a semiconductor device structure formed on a substrate, and wherein the forming of the contact cavity comprises: delivering a process gas to a processing region of a plasma processing chamber, wherein the process gas comprises hydrogen ($H_2$), chlorine ($Cl_2$) and one or more inert gases; delivering a radio frequency (RF) signal to a first electrode within the plasma processing chamber to form a plasma that comprises the process gas, wherein the plasma is formed over a surface of the semiconductor device structure of the substrate; and biasing the substrate, while the plasma is formed, for a first period of time, wherein biasing the substrate comprises delivering a first substrate bias signal to a second electrode disposed within a substrate support, and wherein a surface of the formed contact cavity comprises a portion of the semiconductor material region.

Embodiments of the present disclosure may further provide a method of forming an electrical contact within a semiconductor device, comprising forming a first contact cavity within a semiconductor material region of a first semiconductor device structure formed on a substrate. Forming the first contact cavity comprises: delivering a first process gas to a processing region of a plasma processing chamber, wherein the first process gas comprises hydrogen ($H_2$), chlorine ($Cl_2$) and one or more inert gases; delivering a first radio frequency (RF) signal to a first electrode within the plasma processing chamber to form a plasma that comprises the first process gas, wherein the plasma is formed over a surface of the first semiconductor device structure of the substrate; controlling a temperature of a substrate supporting surface of a substrate support to between about −100° C. and about 200° C.; and biasing the substrate while the plasma is formed within the processing region. Biasing the substrate comprises: delivering a first substrate bias signal to a second electrode disposed within a substrate support for a first period of time; and delivering a second substrate bias signal to the second electrode for a second period of time, wherein a magnitude of the second bias signal is less than a magnitude of the first bias signal. A surface of the formed first contact cavity comprises a portion of the semiconductor material region.

Embodiments of the present disclosure may further provide a method of forming an electrical contact within a semiconductor device, comprising forming a contact cavity within a source/drain region of a semiconductor device structure formed on a substrate. The source/drain region comprises a silicon germanium ($Si_xGe_{1-x}$) layer. Forming the contact cavity comprises: delivering a process gas to a processing region of a plasma processing chamber, wherein the process gas comprises hydrogen ($H_2$), chlorine ($Cl_2$) and one or more inert gases; delivering a radio frequency (RF) signal to a first electrode within the plasma processing chamber to form a plasma that comprises the process gas, wherein the plasma is formed over a surface of the semiconductor device structure of the substrate; and biasing the substrate, while the plasma is formed, for a first period of time, wherein biasing the substrate comprises delivering a first substrate bias signal to a second electrode disposed within a substrate support. A surface of the formed contact cavity comprises a portion of the silicon germanium ($Si_xGe_{1-x}$) layer.

Embodiments of the present disclosure may further provide a method of forming an electrical contact within a semiconductor device, comprising forming a contact cavity within a source/drain region of a semiconductor device structure formed on a substrate, wherein the source/drain region comprises a silicon germanium ($Si_xGe_{1-x}$) layer. The forming of the contact cavity comprises: delivering a process gas to a processing region of a plasma processing chamber, wherein the process gas comprises hydrogen ($H_2$), chlorine ($Cl_2$) and one or more inert gases; delivering a radio frequency (RF) signal to a first electrode within the plasma processing chamber to form a plasma that comprises the process gas, wherein the plasma is formed over a surface of the semiconductor device structure of the substrate; controlling a temperature of a substrate supporting surface of a substrate support to between about −100° C. and about 200° C.; and biasing the substrate while the plasma is formed within the processing region. Biasing the substrate comprises: delivering a first substrate bias signal to a second electrode disposed within a substrate support for a first period of time; and delivering a second substrate bias signal to the second electrode for a second period of time, wherein a magnitude of the second bias signal is less than a magnitude of the first bias signal; and wherein a surface of the formed contact cavity comprises the silicon germanium ($Si_xGe_{1-x}$) layer.

Embodiments of the present disclosure may further provide a method of forming an electrical contact within a semiconductor device, comprising: forming a contact cavity within a semiconductor material region of a semiconductor device structure formed on a substrate, and wherein the forming of the contact cavity comprises: delivering a process gas to a processing region of a plasma processing chamber, wherein the process gas comprises hydrogen ($H_2$), a chlorine containing gas, and one or more inert gases; delivering a radio frequency (RF) signal to a first electrode within the plasma processing chamber to form a plasma that comprises the process gas, wherein the plasma is formed over a surface of the semiconductor device structure of the substrate; and biasing the substrate, while the plasma is formed, for a first period of time, wherein biasing the substrate comprises delivering a first substrate bias signal to a second electrode disposed within a substrate support, and wherein a surface of the formed contact cavity comprises a portion of the semiconductor material region.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

FIGS. 4B, 4C1, 4C2, and 4D depict cross-sectional views of a portion of the gate-all-around (GAA) device illustrated in FIG. 4A at different stages of device fabrication, according to one or more embodiments.

FIGS. 4E, 4F, 4G1, 4G2 and 4H depict cross-sectional views of a portion of the gate-all-around (GAA) device illustrated in FIG. 4A at different stages of device fabrication, according to one or more embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

The embodiments described herein provide methods and systems for forming contacts that include an improved electrical contact that can be used in various types of integrated circuit (IC) devices. Embodiments of the disclosure provided herein include the formation of a cavity within a source/drain contact trench of a contact structure that is used to form, for example, a portion of a complementary metal oxide semiconductor (CMOS) device. The formed cavity is configured to increase a contact interface surface area, without increasing a critical dimension (CD) of the source/drain contact trench, and also improve the contact resistance of a formed electrical contact within a formed IC device. The embodiments described herein also provide methods and systems for forming an electrical contact that includes a metal silicide on a portion of a contact structure that is used to form, for example, a CMOS device. The methods and systems may be particularly useful for forming, in a semiconductor structure having a region that includes silicon, a region that includes silicon germanium, a dielectric layer formed thereover, and a metal silicide contact (e.g. molybdenum silicide ($MoSi_2$), ruthenium silicide ($Ru_xSi_y$), titanium silicide (TiSi), etc.) formed on an exposed surface of a semiconductor material containing surface, such as a silicon germanium (SiGe) material or a doped silicon (Si) material, within an opening or feature (e.g., source/drain contact trench) in the dielectric layer. The embodiments described herein also provide methods and systems for forming a contact that includes an epitaxial layer of silicon-containing material (e.g., boron-doped p-type silicon germanium or phosphorus-doped n-type silicon) on a selected portion (e.g., exposed surface of a layer of silicon or silicon germanium) of a structure that is used to form a portion of a MOS FET device, such as a CMOS device.

Figure 1:
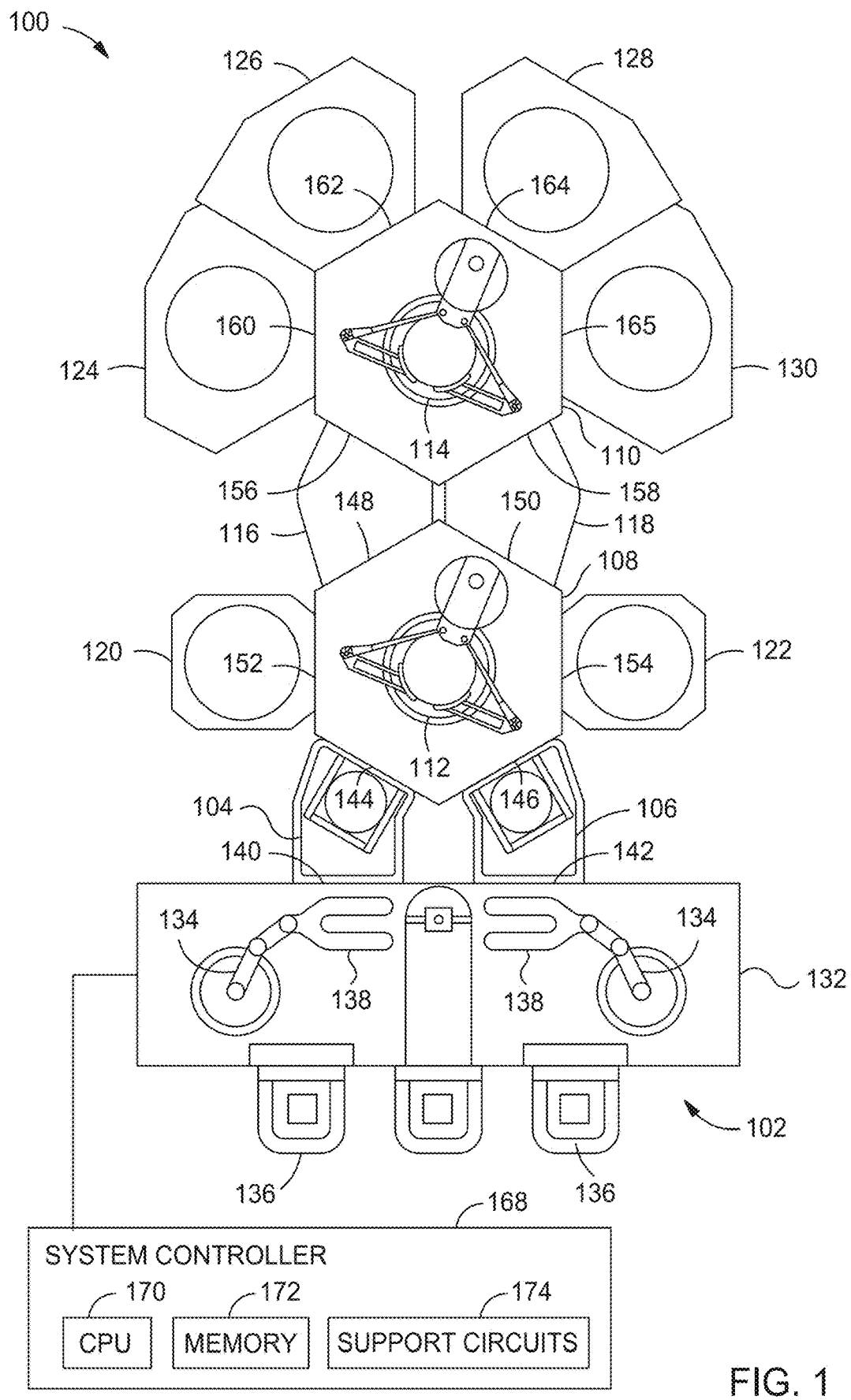
FIG. 1 is a schematic top view of a multi-chamber processing system according to one or more embodiments of the present disclosure.

FIG. 1 is a schematic top view of a multi-chamber processing system 100, according to one or more embodiments of the present disclosure. The processing system 100 generally includes a factory interface 102, load lock chambers 104, 106, transfer chambers 108, 110 with respective transfer robots 112, 114, holding chambers 116, 118, and processing chambers 120, 122, 124, 126, 128, and 130. As detailed herein, in some embodiments, substrates in the processing system 100 are processed in and transferred between the various chambers without exposing the substrates to an ambient environment exterior to the processing system 100 (e.g., an atmospheric ambient environment such as may be present in a fab). For example, the substrates can be processed in and transferred between the various chambers maintained at a low pressure (e.g., less than or equal to about 300 Torr) or vacuum environment without breaking the low pressure or vacuum environment among various processes performed on the substrates in the processing system 100. Accordingly, in some embodiments, the processing system 100 may provide for an integrated solution for some processing of substrates. However, in some embodiments, an ex-situ processing method may be used. The ex-situ processing method will include the performance of a plurality of process steps within a first multi-chamber processing system and a different plurality of process steps being performed within a second multi-chamber processing system. The ex-situ processing method will include a vacuum break step that is needed to transfer the substrates between the first and the second processing systems.

Examples of a processing system that may be suitably modified in accordance with the teachings provided herein include the Endura®, Producer® or Centura® integrated processing systems or other suitable processing systems commercially available from Applied Materials, Inc., located in Santa Clara, California. It is contemplated that other processing systems (including those from other manufacturers) may be adapted to benefit from aspects described herein.

In the illustrated example of FIG. 1, the factory interface 102 includes a docking station 132 and factory interface robots 134 to facilitate transfer of substrates. The docking station 132 is adapted to accept one or more front opening unified pods (FOUPs) 136. In some examples, each factory interface robot 134 generally includes a blade 138 disposed on one end of the respective factory interface robot 134 adapted to transfer the substrates from the factory interface 102 to the load lock chambers 104, 106.

The load lock chambers 104, 106 have respective ports 140, and 142 coupled to the factory interface 102 and respective ports 144, and 146 coupled to the transfer chamber 108. The transfer chamber 108 further has respective ports 148, and 150 coupled to the holding chambers 116, and 118 and respective ports 152, 154 coupled to processing chambers 120, and 122. Similarly, the transfer chamber 110 has respective ports 156, and 158 coupled to the holding chambers 116, 118 and respective ports 160, 162, and 164, and 166 coupled to processing chambers 124, 126, 128, and 130. The ports 144, 146, 148, 150, 152, 154, 156, 158, 160, 162, 164, and 166 can be, for example, slit valve openings with slit valves for passing substrates therethrough by the transfer robots 112, 114 and for providing a seal between respective chambers to prevent a gas from passing between the respective chambers. Generally, any port is open for transferring a substrate therethrough. Otherwise, the port is closed.

The load lock chambers 104, 106, transfer chambers 108, 110, holding chambers 116, 118, and processing chambers 120, 122, 124, 126, 128, and 130 may be fluidly coupled to a gas and pressure control system (not specifically illustrated). The gas and pressure control system can include one or more gas pumps (e.g., turbo pumps, cryo-pumps, roughing pumps), gas sources, various valves, and conduits fluidly coupled to the various chambers. In operation, a factory interface robot 134 transfers a substrate from a FOUP 136 through a port 140 or 142 to a load lock chamber 104 or 106. The gas and pressure control system then pumps down the load lock chamber 104 or 106. The gas and pressure control system further maintains the transfer chambers 108, 110 and holding chambers 116, 118 with an interior low pressure or vacuum environment (which may include an inert gas). Hence, the pumping down of the load lock chamber 104 or 106 facilitates passing the substrate between, for example, the atmospheric environment of the factory interface 102 and the low pressure or vacuum environment of the transfer chamber 108.

With the substrate in the load lock chamber 104 or 106 that has been pumped down, the transfer robot 112 transfers the substrate from the load lock chamber 104 or 106 into the transfer chamber 108 through the port 144 or 146. The transfer robot 112 is then capable of transferring the substrate to and/or between any of the processing chambers 120, 122 through the respective ports 152, 154 for processing and the holding chambers 116, 118 through the respective ports 148, 150 for holding to await further transfer. Similarly, the transfer robot 114 is capable of accessing the substrate in the holding chamber 116 or 118 through the port 156 or 158 and is capable of transferring the substrate to and/or between any of the processing chambers 124, 126, 128, 130 through the respective ports 160, 162, 164, 166 for processing and the holding chambers 116, 118 through the respective ports 156, 158 for holding to await further transfer. The transfer and holding of the substrate within and among the various chambers can be in the low pressure or vacuum environment provided by the gas and pressure control system.

The processing chambers 120, 122, 124, 126, 128, and 130 can be any appropriate chamber for processing a substrate. In some examples, the processing chamber 120 can be capable of performing an etch process, the processing chamber 122 can be capable of performing a cleaning process, the processing chamber 124 can be capable of performing a selective removal process, and the processing chambers 126, 128, 130 can be capable of performing respective epitaxial growth processes. The processing chamber 120 may be a Sym3® or Selectra™ Etch chamber available from Applied Materials of Santa Clara, Calif. The processing chamber 122 may be a Clarion™ or SiCoNi™ Pre-clean chamber available from Applied Materials of Santa Clara, Calif. The processing chamber 126, 128, or 130 may be a Centura™ Epi chamber available from Applied Materials of Santa Clara, Calif.

A system controller 168 is coupled to the processing system 100 for controlling the processing system 100 or components thereof. For example, the system controller 168 may control the operation of the processing system 100 using a direct control of the chambers 104, 106, 108, 110, 116, 118, 120, 122, 124, 126, 128, and 130 of the processing system 100 or by controlling controllers associated with the chambers 104, 106, 108, 110, 116, 118, 120, 122, 124, 126, 128, and 130. In operation, the system controller 168 enables data collection and feedback from the respective chambers to coordinate performance of the processing system 100.

The system controller 168 generally includes a central processing unit (CPU) 170, memory 172, and support circuits 174. The CPU 170 may be one of any form of a general purpose processor that can be used in an industrial setting. The memory 172, or non-transitory computer-readable medium, is accessible by the CPU 170 and may be one or more of memory such as random access memory (RAM), read only memory (ROM), floppy disk, hard disk, or any other form of digital storage, local or remote. The support circuits 174 are coupled to the CPU 170 and may comprise cache, clock circuits, input/output subsystems, power supplies, and the like. The various methods disclosed herein may generally be implemented under the control of the CPU 170 by the CPU 170 executing computer instruction code stored in the memory 172 (or in memory of a particular processing chamber) as, for example, a software routine. When the computer instruction code is executed by the CPU 170, the CPU 170 controls the chambers to perform processes in accordance with the various methods disclosed herein.

Other processing systems can be in other configurations. For example, more or fewer processing chambers may be coupled to a transfer apparatus. In the illustrated example, the transfer apparatus includes the transfer chambers 108, 110 and the holding chambers 116, 118. In other examples, more or fewer transfer chambers (e.g., one transfer chamber) and/or more or fewer holding chambers (e.g., no holding chambers) may be implemented as a transfer apparatus in a processing system.

Figure 2A:
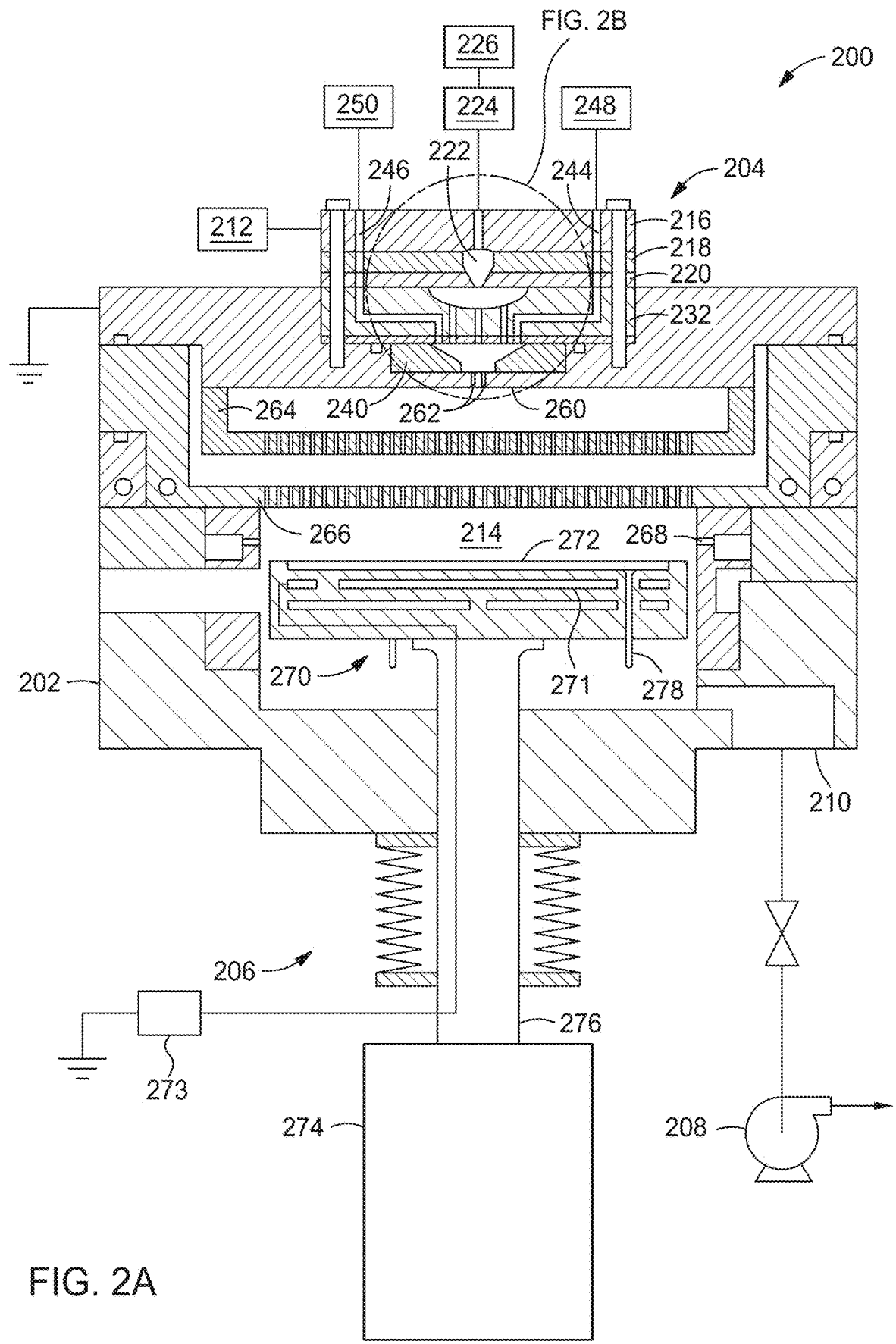
FIG. 2A is a cross sectional view of a processing chamber, according to one or more embodiments.
Figure 2B:
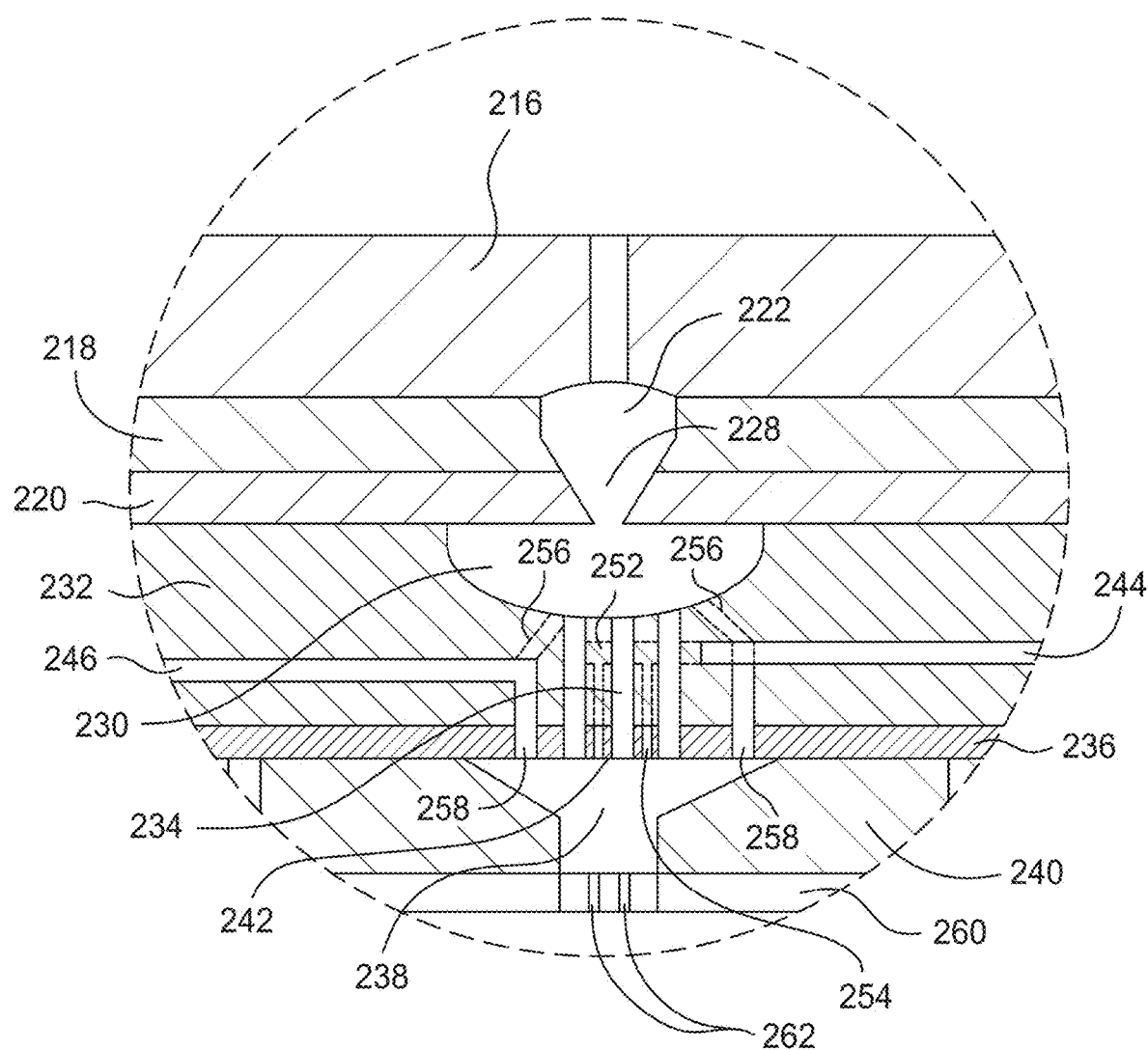
FIG. 2B is an enlarged view of a portion of the processing chamber of FIG. 2A.

FIG. 2A is a cross sectional view of a processing chamber 200, according to one or more embodiments, that is adapted to perform a pre-clean process and/or a plasma enhanced etching or deposition process as detailed below. The processing chamber 200 may be the processing chamber 122 shown in FIG. 1. FIG. 2B is an enlarged view of a portion of the processing chamber 200 of FIG. 2A.

The processing chamber 200 may be particularly useful for performing a thermal or plasma-based cleaning process and/or a plasma assisted dry etch process. The processing chamber 200 includes a chamber body 202, a lid assembly 204, and a support assembly 206. The lid assembly 204 is disposed at an upper end of the chamber body 202, and the support assembly 206 is at least partially disposed within the chamber body 202. A vacuum system can be used to remove gases from processing chamber 200. The vacuum system includes a vacuum pump 208 coupled to a vacuum port 210 disposed in the chamber body 202. The processing chamber 200 also includes a controller 212 for controlling processes within the processing chamber 200.

The lid assembly 204 includes stacked components adapted to provide precursor gases and/or a plasma to a processing region 214 within the processing chamber 200. A first plate 216 is coupled to a second plate 218. A third plate 220 is coupled to the second plate 218. The lid assembly 204 may be connected to a power source (not shown) for supplying a plasma to a cone-shaped chamber 222 formed in the lid assembly 204. The lid assembly 204 can also be connected to a remote plasma source 224 that creates the plasma upstream of the lid stack. The remote plasma cavity (e.g., the processing region 214, the first plate 216, and the second plate 218 in FIGS. 2A-2B) is coupled to a gas source 226 via the remote plasma source 224 (or the gas source 226 is coupled directly to the lid assembly 204 in the absence of the remote plasma source 224). The gas source 226 may include a gas source that is adapted to provide helium, argon, or other inert gas. In some configurations, the gas provided by the gas source 226 can be energized into a plasma that is provided to the lid assembly 204 by use of the remote plasma source 224. In alternate embodiments, the gas source 226 may provide process gases that can be activated by the remote plasma source 224 prior to being introduced to a surface of the substrate that is disposed within the processing chamber 200. Referring to FIG. 2B, the cone-shaped chamber 222 has an opening 228 that allows a formed plasma to flow from the remote plasma source 224 to a volume 230 formed in a fourth plate 232 of the lid assembly 204.

In some configurations of the lid assembly 204, a plasma is generated within the cone-shaped chamber 222 by the application of energy delivered from a plasma source. In one example, the energy can be provided by biasing the lid assembly 204 to capacitively couple RF, VHF and/or UHF energy to the gases positioned in the cone-shaped chamber 222. In this configuration of the lid assembly 204, the remote plasma source 224 may not be used, or not be installed within the lid assembly 204.

A central conduit 234, which is formed in the fourth plate 232, is adapted to provide the plasma generated species provided from the volume 230 through a fifth plate 236 to a mixing chamber 238 formed in a sixth plate 240 of the lid assembly 204. The central conduit 234 communicates with the mixing chamber 238 through an opening 242 in the fifth plate 236. The opening 242 may have a diameter less than, greater than or the same as a diameter of the central conduit 234. In the embodiment of FIG. 2B, the opening 242 has diameter the same as the central conduit 234.

The fourth plate 232 also includes inlets 244 and 246 that are adapted to provide gases to the mixing chamber 238. The inlet 244 is coupled to a first gas source 248 and the inlet 246 is coupled to a second gas source 250. The first gas source 248 and the second gas source 250 may include processing gases as well as inert gases, for example inert gases such as argon and/or helium, utilized as a carrier gas. The first gas source 248 may include ammonia ($NH_3$) as well as argon (Ar). The second gas source 250 may contain fluorine containing gases, hydrogen containing gases, or a combination thereof. In one example, the second gas source 250 may contain hydrogen fluoride (HF) as well as argon (Ar).

As illustrated in FIG. 2B, in some configurations, the inlet 244 is coupled to the mixing chamber 238 through a cylindrical channel 252 (shown in phantom) and holes 254 formed in the fifth plate 236. The inlet 246 is coupled to the mixing chamber 238 through a cylindrical channel 256 (shown in phantom) and holes 258 formed in the fifth plate 236. The holes 254, 258 formed in the fifth plate 236 are generally sized so that they enable a uniform flow of gases, which are provided from their respective gas source 248, 250, into the mixing chamber 238. In one configuration, the holes 258 have a diameter that is less than a width of the opening defined by the opposing sidewalls of the cylindrical channel 256 formed in the fourth plate 232. The holes 258 are typically distributed around the circumference of the center-line of the cylindrical channel 256 to provide uniform fluid flow into the mixing chamber 238. In one configuration, the holes 254 have a diameter that is less than a width of the opening defined by the opposing sidewalls of the cylindrical channel 252 formed the fourth plate 232. The holes 254 are typically distributed around the circumference of the center-line of the cylindrical channel 252 to provide uniform fluid flow into the mixing chamber 238.

The inlets 244 and 246 provide respective fluid flow paths laterally through the fourth plate 232, turning toward and penetrating through the fifth plate 236 to the mixing chamber 238. The lid assembly 204 also includes a seventh plate or first gas distributor 260, which may be a gas distribution plate, such as a showerhead, where the various gases mixed in the lid assembly 204 are flowed through perforations 262 formed therein. The perforations 262 are in fluid communication with the mixing chamber 238 to provide flow pathways from the mixing chamber 238 through the first gas distributor 260. Referring back to FIG. 2A, a blocker plate 264 and a gas distribution plate, such as a second gas distribution plate 266, which may be a gas distribution plate, such as a showerhead, is disposed below the lid assembly 204.

Alternatively, a different cleaning process may be utilized to clean the substrate surface. For example, a remote plasma containing helium (He) and ammonia ($NH_3$) may be introduced into the processing chamber 200 through the lid assembly 204, while ammonia ($NH_3$) may be directly injected into the processing chamber 200 via a separate gas inlet 268 that is disposed at a side of the chamber body 202 and coupled to a gas source (not shown).

The support assembly 206 may include a substrate support 270 to support a substrate 272 thereon during processing. The substrate support 270 may be coupled to an actuator 274 by a shaft 276 which extends through a centrally-located opening formed in a bottom of the chamber body 202. The actuator 274 may be flexibly sealed to the chamber body 202 by bellows (not shown) that prevent vacuum leakage around the shaft 276. The actuator 274 allows the substrate support 270 to be moved vertically within the chamber body 202 between a processing position and a loading position. The loading position is slightly below the opening of a tunnel (not shown) formed in a sidewall of the chamber body 202.

The substrate support 270 has a flat, or a substantially flat, substrate supporting surface for supporting a substrate 272 to be processed thereon. The substrate support 270 may be moved vertically within the chamber body 202 by the actuator 274, which is coupled to the substrate support 270 by the shaft 276. For some process operations, the substrate support 270 may be elevated to a position in close proximity to the lid assembly 204 to control the temperature of the substrate 272 being processed. As such, the substrate 272 may be heated via radiation emitted from the second gas distribution plate 266, or another radiant source, or by convection or conduction from the second gas distribution plate 266 through an intervening gas. In some process steps, the substrate may be disposed on lift pins 278 to perform additional thermal processing operations, such as performing an annealing step.

Figure 3:
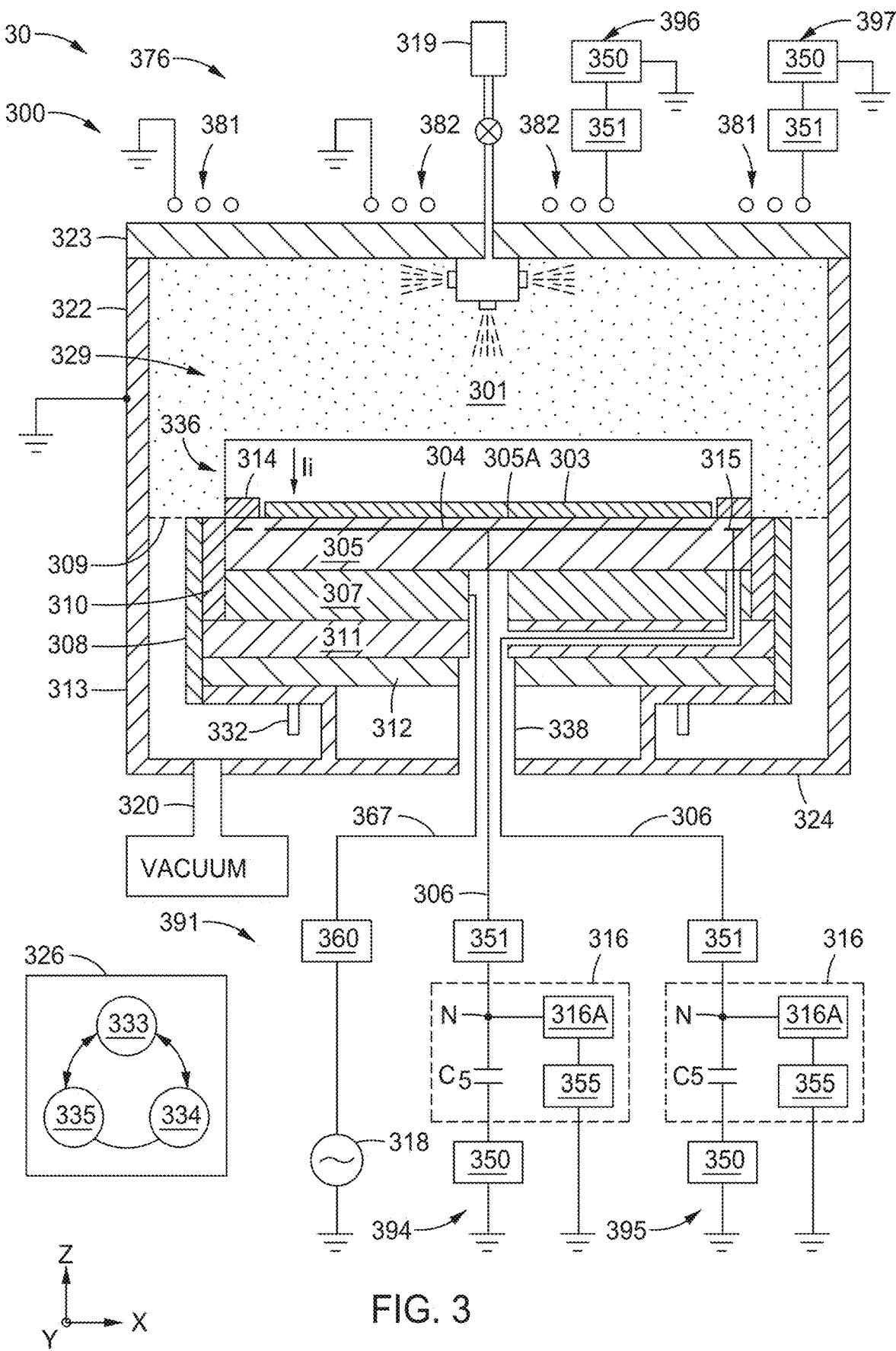
FIG. 3 is a cross sectional view of a processing chamber, according to one or more embodiments.

FIG. 3 is a schematic cross-sectional view of a processing system 30 that is configured to perform one or more of the plasma processing methods set forth herein. In some embodiments, the processing systems 30 is configured for plasma-assisted etching processes, such as a reactive ion etch (RIE) plasma processing. However, it should be noted that the embodiments described herein may be also be used with processing systems configured for use in other plasma-assisted processes, such as plasma-enhanced deposition processes, for example, plasma-enhanced chemical vapor deposition (PECVD) processes, plasma-enhanced atomic layer deposition (PEALD) processes, plasma treatment processing or plasma-based ion implant processing, for example, plasma doping (PLAD) processing.

The processing system 30 generally includes a processing chamber 300, a lid assembly 376, a support assembly 336, and a system controller 326. As shown, the processing system 30 includes a plurality of plasma source assemblies that are each adapted to deliver a radio frequency (RF), direct current (DC) or pulsed voltage waveforms to one or more electrodes and/or one or more coils disposed within the processing chamber 300. In one configuration example, as shown in FIG. 3, the processing chamber 300 includes four plasma source assemblies, such as a first capacitively coupled plasma (CCP) assembly 394, a second capacitively coupled plasma (CCP) assembly 395, a first inductively coupled plasma (ICP) assembly 396, and a second inductively coupled plasma (ICP) assembly 397. In some embodiments, the processing chamber 300 includes an additional optional source assembly 391 that is configured to deliver an RF signal to an electrode within the processing chamber 300 to generate and/or sustain a plasma 301 within a processing volume 329 of the processing chamber 300.

The processing chamber 300 typically includes a chamber body 313 that includes one or more sidewalls 322 and a chamber base 324, which collectively, with a chamber lid 323 of the lid assembly 376, define the processing volume 329. The one or more sidewalls 322 and chamber base 324 generally include materials that are sized and shaped to form the structural support for the elements of the processing chamber 300 and are configured to withstand the pressures and added energy applied to them while the plasma 301 is generated within a vacuum environment maintained in the processing volume 329 of the processing chamber 300 during processing. In one example, the one or more sidewalls 322 and chamber base 324 are formed from a metal, such as aluminum, an aluminum alloy, or a stainless steel alloy. A gas inlet 328 disposed through the chamber lid 323 is used to deliver one or more processing gases to the processing volume 329 from a processing gas source 319 that is in fluid communication therewith. The processing chamber 300 includes a vacuum pump 320. A substrate 303 is loaded into, and removed from, the processing volume 329 through an opening (not shown) in one of the one or more sidewalls 322, which is sealed with a slit valve (not shown) during plasma processing of the substrate 303. The gas source 319 is configured to provide one or more of the processing gases to the processing volume 329 of the processing chamber 300. The gas source 319 is configured to provide one or more gases utilized in the methods described herein, such as a halogen containing gas (e.g., $Cl_2$, $Br_2$, $F_2$, $I_2$, HBr, HCl, $CH_3F$, $C_4F_8$, $CHF_3$, etc.), a hydrogen containing gas (e.g., $H_2$), an oxygen containing gas (e.g., $O_2$), and one or more inert gases (e.g., He, Ar, Ne, Kr, etc.).

The system controller 326, also referred to herein as a processing chamber controller, includes a central processing unit (CPU) 333, a memory 334, and support circuits 335. The system controller 326 can also form part of the system controller 168 described above. The system controller 326 is used to control the process sequence used to process the substrate 303, including the plasma processing and substrate biasing methods described herein. The CPU 333 is a general-purpose computer processor configured for use in an industrial setting for controlling the processing chamber and sub-processors related thereto. The memory 334 described herein, which is generally non-volatile memory, may include random access memory, read-only memory, floppy or hard disk drive, or other suitable forms of digital storage, local or remote. The support circuits 335 are conventionally coupled to the CPU 333 and comprise cache, clock circuits, input/output subsystems, power supplies, and the like, and combinations thereof. Software instructions (program) and data can be coded and stored within the memory 334 for instructing a processor within the CPU 333. A software program (or computer instructions) readable by CPU 333 in the system controller 326 determines which tasks are performable by the components in the processing system 30. Typically, the software program, which is readable by CPU 333 in the system controller 326, includes code, which, when executed by the processor (CPU 333), performs tasks relating to the plasma processing methods described herein. The program may include instructions that are used to control the various hardware and electrical components within the processing system 30 to perform the various process tasks and various process sequences used to implement the methods described herein.

In some embodiments, the lid assembly 376 includes the chamber lid 323 and the one or more plasma source assemblies, such as two inductively coupled plasma (ICP) assemblies 396, 397 illustrated in FIG. 3. As shown in FIG. 3, each ICP assembly 396, 397 includes a coil 381, 382, respectively, that is configured to inductively couple a biasing signal generated by a generator 350 to a plasma 301 formed in the processing volume 329 of the processing chamber 300 during plasma processing. In this configuration, the chamber lid 323 includes a dielectric material that is configured to allow the fields generated by the coils 381, 382 during the delivery of the biasing signal, such as an RF signal provided by the generator 350 and through an RF match 351 to help generate and sustain the plasma 301 in the processing volume 329. The provided RF signal can include the delivery of an RF waveform at a frequency between 100 kHz and 120 MHz, such as frequency between 2 MHz and 60 MHZ, at a RF power level between 100 Watts and about 1000 Watts.

However, in some alternate embodiments of the chamber 300, the lid assembly 376 includes the chamber lid 323 that includes one or more of the capacitively coupled plasma (CCP) assemblies, such as an RF driven showerhead assembly that is disposed over a surface of a substrate during plasma processing.

The substrate support assembly 336, as shown in FIG. 3, includes a substrate support 305 (e.g., ESC substrate support) and one or more lower electrodes, which are coupled to a biasing source assembly, such as the source assemblies 394, 395. In some embodiments, the substrate support assembly 336 can additionally include a support base 307, an insulator plate 311, a ground plate 312 and substrate lift assembly 332. The support base 307 is electrically isolated from the chamber base 324 by the insulator plate 311, and the ground plate 312 is interposed between the insulator plate 311 and the chamber base 324. The substrate support 305 is thermally coupled to and disposed on the support base 307. In some embodiments, the support base 307 is configured to regulate the temperature of the substrate support 305, and the substrate 303 disposed on the substrate support 305, during substrate processing. Typically, the substrate support 305 is formed of a dielectric material, such as a bulk sintered ceramic material, such as a corrosion-resistant metal oxide or metal nitride material, for example, aluminum oxide ($Al_2O_3$), aluminum nitride (AlN), titanium oxide (TiO), titanium nitride (TiN), yttrium oxide ($Y_2O_3$), mixtures thereof, or combinations thereof. In embodiments herein, the substrate support 305 further includes the bias electrode 304 embedded in the dielectric material thereof.

The one or more lower electrodes can include a bias electrode 304 and/or an edge electrode 315 that are formed within the substrate support 305, and are coupled to one or more source assemblies, such as the two source assemblies 394, 395. The source assembly 394 is coupled to the bias electrode 304 and the source assembly 395 is coupled to the edge electrode 315, and are each configured to deliver a waveform generated by a source generator 350 to a plasma 301 formed in the processing volume 329 of the processing chamber 300 during plasma processing. In some embodiments, the source assemblies 394, 395 include an RF power source, a DC power source, or a pulsed DC power source that are configured to deliver a biasing signal, such as an RF signal, constant DC signal, or asymmetric pulsed voltage waveform provided by the generator 350 to help bias the substrate and/or generate and sustain the plasma 301 in the processing volume 329. In some embodiments, the biasing signal comprises an RF signal that is provided at a frequency between 100 kHz and 120 MHz, such as frequency between 2 MHz and 60 MHZ, at an RF power level between zero and about 1000 Watts, such as between about 5 Watts and 500 Watts. In some other embodiments, the biasing signal comprises an asymmetric pulsed DC signal that is provided at a frequency between 100 kHz and 500 kHz, an on-time duty cycle of between 10% and 95%, at an applied voltage level between about +100 Volts and −8000 volts, such as between about +10 Volts and −5000 volts. In some other embodiments, the biasing signal comprises a constant DC signal that is provided at an applied voltage level between about +5000 Volts and −8000 volts.

In one configuration, the bias electrode 304 is a chucking pole used to secure (i.e., chuck) the substrate 303 to the substrate supporting surface 305A of the substrate support 305 and to bias the substrate 303 with respect to the processing plasma 301 using one or more of the biasing schemes described herein. Typically, the bias electrode 304 is formed of one or more electrically conductive parts, such as one or more metal meshes, foils, plates, or combinations thereof.

The source assemblies 394, 395 may also each include a clamping network 316 so that a high voltage bias applied to the bias electrode 304 and/or edge control electrode 315. In some embodiments, the bias electrode 304 is electrically coupled to a clamping network 316 and the edge electrode 315 is electrically coupled to a clamping network 316. The clamping networks provide a chucking voltage thereto, such as static DC voltage between about −5000 V and about +5000 V, using an electrical conductor, such as the coaxial power delivery line 306 (e.g., a coaxial cable). The clamping network 316 includes bias compensation circuit elements 316A, a DC power supply 355, and a bias compensation module blocking capacitor, which is also referred to herein as the blocking capacitor C5. The blocking capacitor C5 is disposed between the output of a generator 350 and the bias electrode 304. Applying similarly configured bias waveforms and clamping voltages to the bias electrode 304 and edge control electrode 315 can help improve the plasma uniformity across the surface of the substrate during processing and thus improve the plasma processing process results.

As discussed above, in some embodiments, the substrate support assembly 336 includes the edge control electrode 315 that is positioned below the edge ring 314 and surrounds the bias electrode 304 and/or is disposed a distance from a center of the bias electrode 304. In general, for a processing chamber 300 that is configured to process circular substrates, the edge control electrode 315 is annular in shape, is made from a conductive material, and is configured to surround at least a portion of the bias electrode 304. In some embodiments, such as shown in FIG. 3, the edge control electrode 315 is positioned within a region of the substrate support 305. In some embodiments, as illustrated in FIG. 3, the edge control electrode 315 includes a conductive mesh, foil, and/or plate that is disposed a similar distance (i.e., Z-direction) from the substrate supporting surface 305A of the substrate support 305 as the bias electrode 304. In some other embodiments, the edge control electrode 315 includes a conductive mesh, foil, and/or plate that is positioned on or within a region of a quartz pipe 310, which surrounds at least a portion of the bias electrode 304 and/or the substrate support 305. Alternately, in some other embodiments (not shown), the edge control electrode 315 is positioned within or is coupled to the edge ring 314, which is disposed on and adjacent to the substrate support 305. In this configuration, the edge ring 314 is formed from a semiconductor or dielectric material (e.g., AlN, etc.).

In some embodiments, the processing chamber 300 includes a source assembly 391 that is configured to deliver an RF signal to an electrode, such as the support base 307, within the processing chamber 300 via a conductive line 367 to generate and/or sustain, such as the support base 307 the plasma 301 in the processing volume 329. In some embodiments, the source assembly 391 includes an RF generator 318 that is configured to deliver an RF waveform signal having a frequency that is greater than 1 MHz or more, or about 2 MHz or more, such as about 13.56 MHz or more through an RF match 360 that is connected to the electrode, which is used to RF bias a substrate during processing.

Cavity Shaping Process Sequence

Figure 4A:
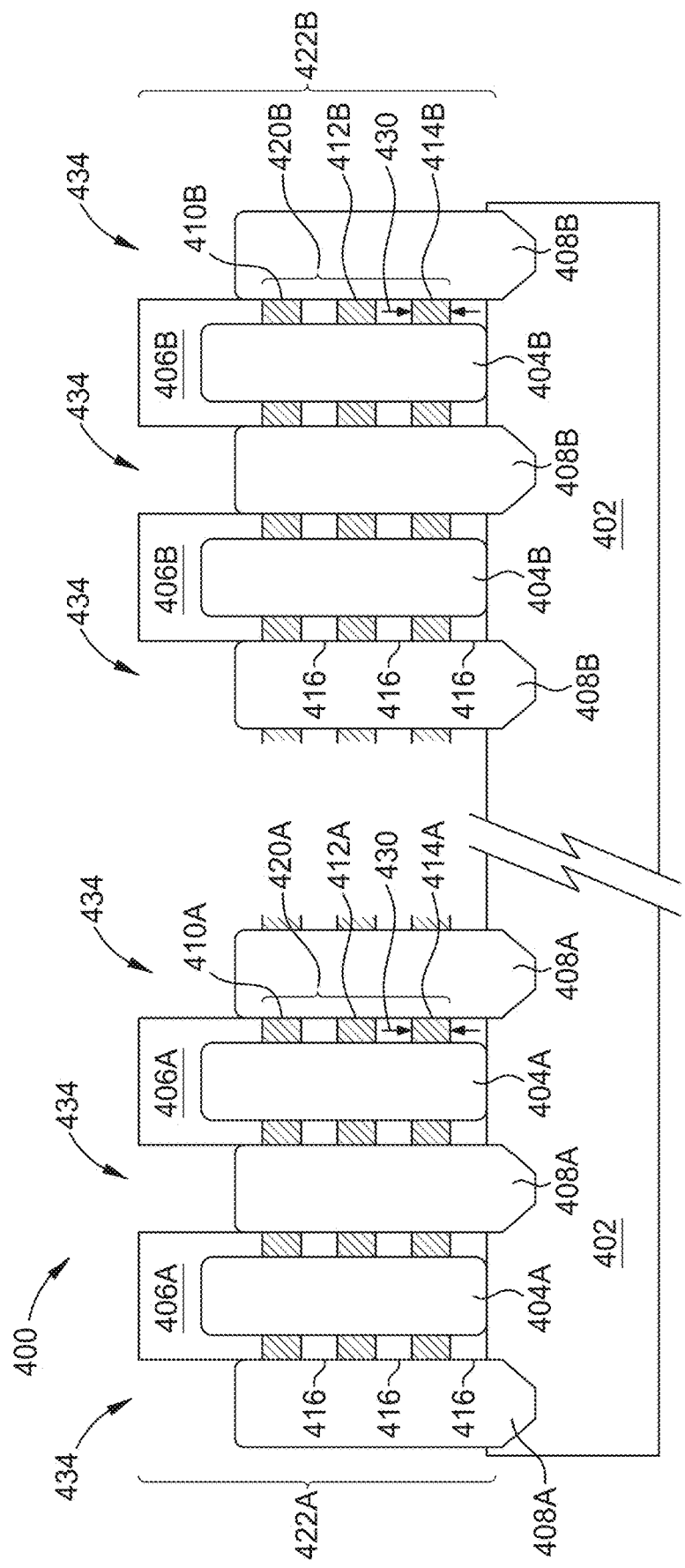
FIG. 4A depicts a cross-sectional view of a gate-all-around (GAA) device with a nanosheet structure in according to one or more embodiments.
Figure 4D:
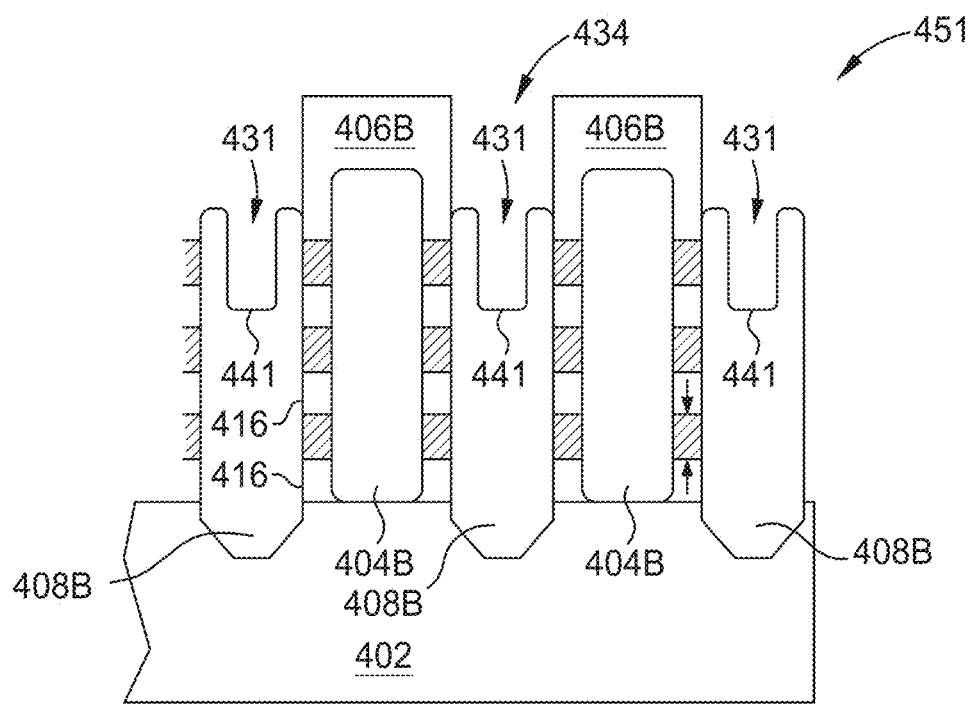
Figure 4D:
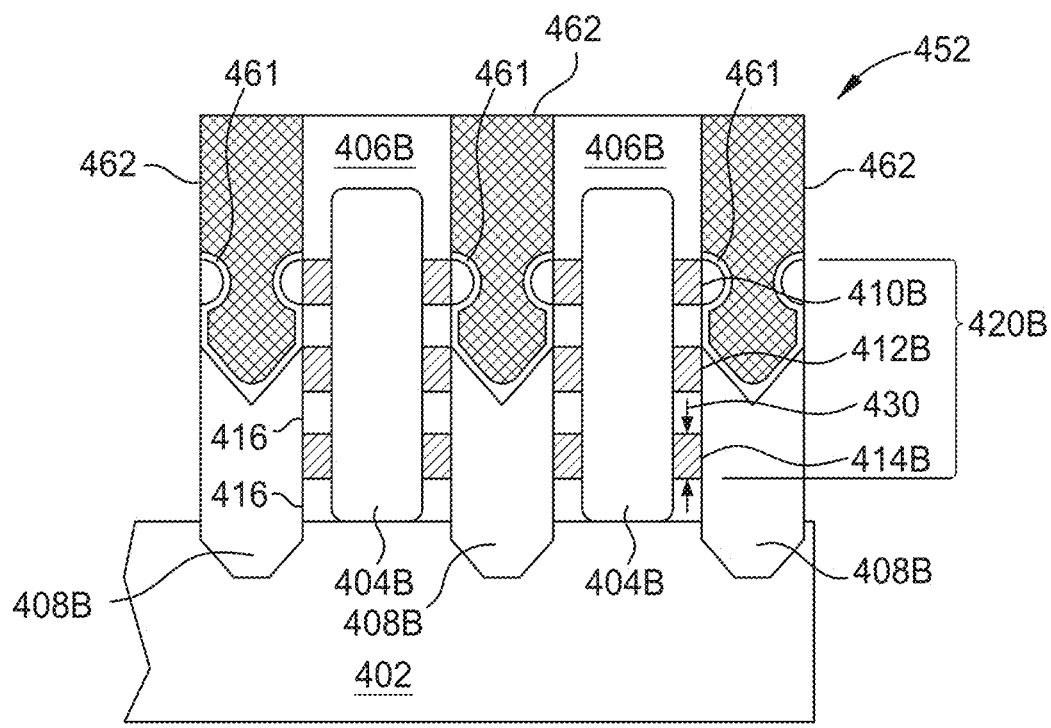
Figure 4E:
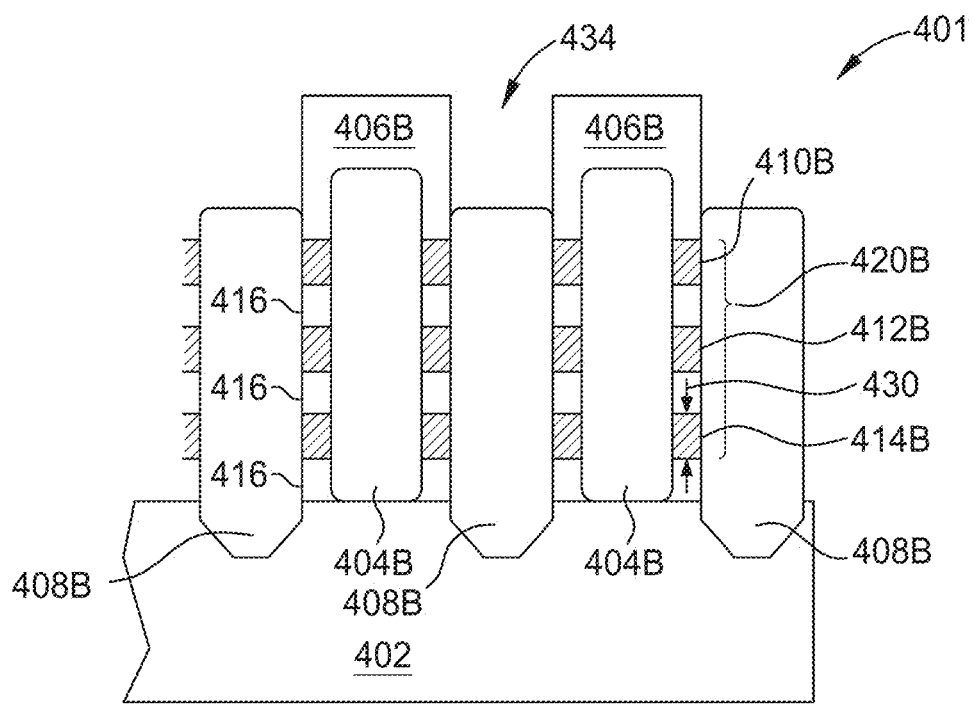
Figure 4F:
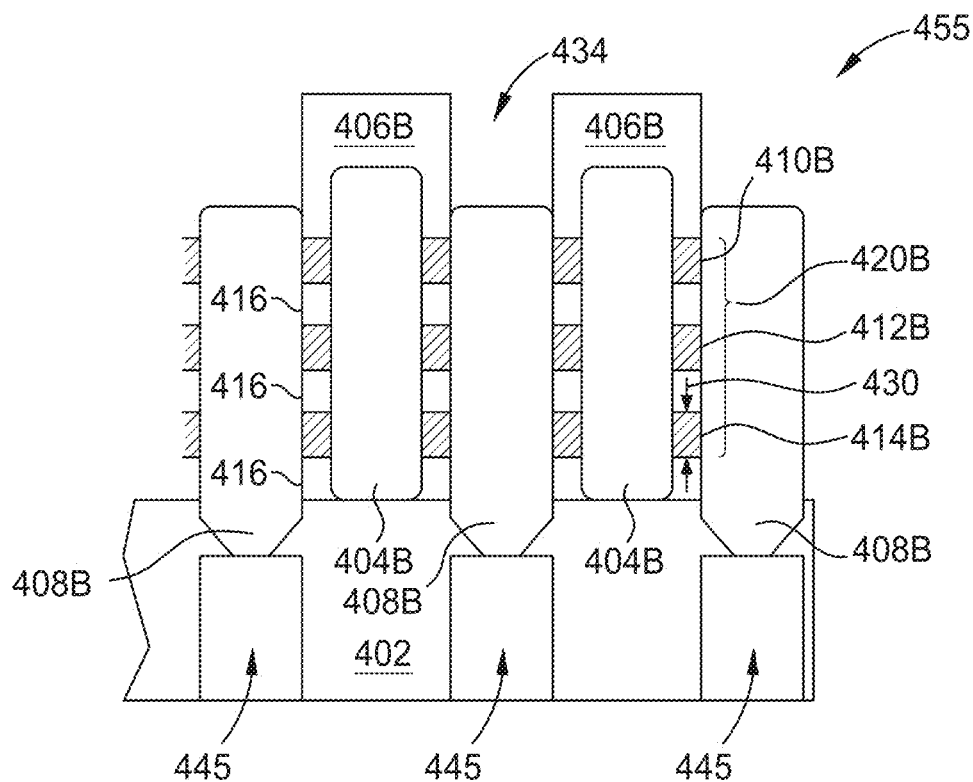
Figure 4H:
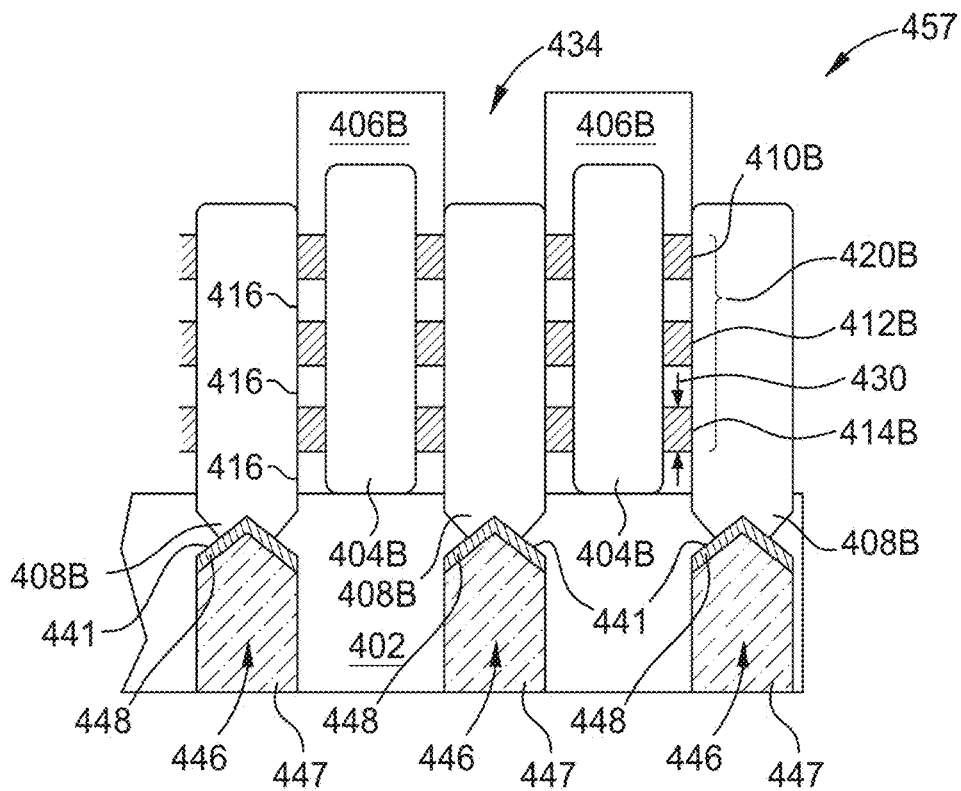
Figure 5A:
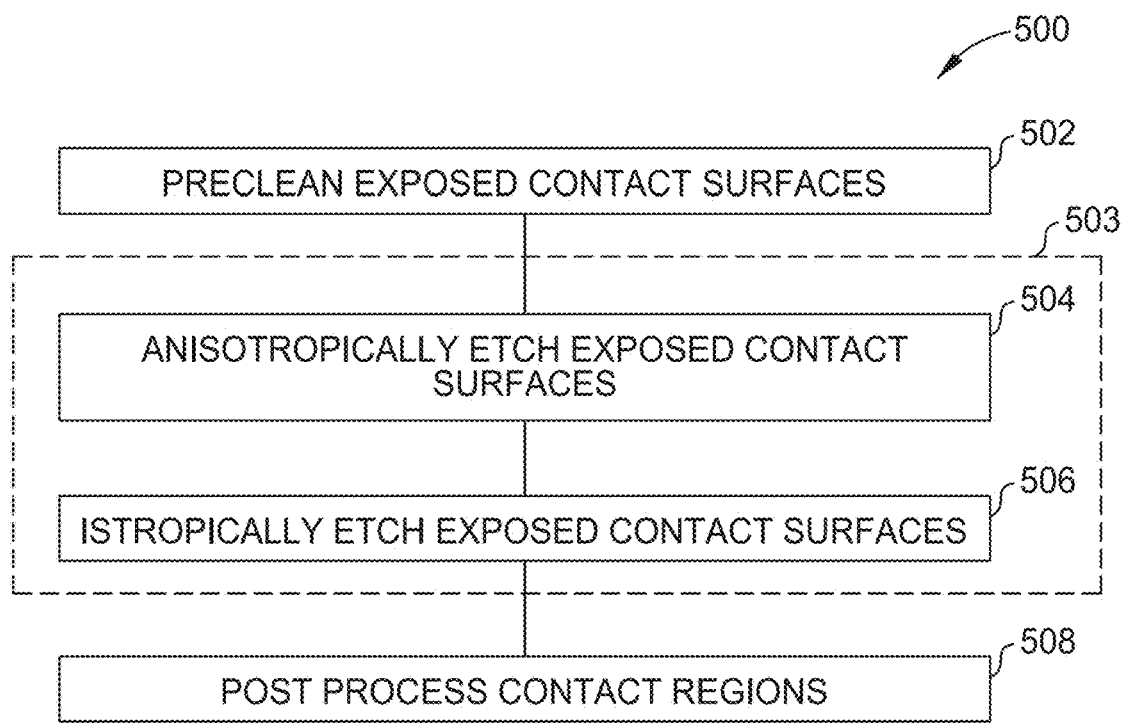
FIG. 5A depicts a process flow diagram of a method of forming a contact cavity in a semiconductor structure, according to one or more embodiments.

FIG. 5A includes a method 500 for forming an electrical contact within a semiconductor device, such as a nanosheet stack-based device (e.g., horizontal gate-all-around (hGAA) transistor device), a backside power delivery network (BSPDN) device and/or a backside power rail (BPR) device. An example of nanosheet structures 420A and 420B include the GAA devices 422A and 422B, respectively, depicted in view 400 of FIG. 4A. The GAA devices 422A and 422B of FIG. 4A are provided herein as examples for use in the processing sequence scenarios described herein. FIGS. 4B-4D illustrate a processing sequence used to form a contact within an hGAA structured device, which is described further below. FIGS. 4E-4H illustrate a processing sequence used to form a contact within a backside power delivery network or backside power rail containing device. The present methods and disclosure provided herein is not intended to be limited by the type of device or process sequences disclosed in relation to FIGS. 4B-4D, 4E-4H, and 5A-5D. Any combination of the method steps described in relation to the method 500 can be used to form a contact cavity in various logic and memory device applications. The cavity shaping processes performed in block 503 of method 500, which may include a single-step cavity shaping process or a multiple-step cavity shaping process (e.g., block 504 and block 506), can be used in various semiconductor device formation processes, which include, but are not limited to, the GAA formation processes disclosed herein.

As illustrated in FIG. 4A, the nanosheet structures 420A, 420B include an n-type metal-oxide-semiconductor field-effect-transistor (nMOS FET) that includes an nMOS GAA device 422A and a p-type MOS FET (pMOS FET) that includes a pMOS GAA device 422B. In this example, if the MOS FET is an nMOS FET, then the source and drain include n+ regions and the body is a p-region. If the MOS FET is a pMOS FET, then the source and drain are p+ regions and the body is an n-region.

The nanosheet structures 420A, 420B are formed on a substrate 402. The term "substrate" as used herein refers to a layer of material that serves as a basis for subsequent processing operations and includes a surface to be cleaned. The substrate may be a silicon based material or any suitable insulating materials or conductive materials as needed. The substrate may include a material such as crystalline silicon (e.g., Si<100> or Si<111>), silicon oxide, strained silicon, silicon germanium, doped or undoped polysilicon, doped or undoped silicon wafers and patterned or non-patterned wafers, silicon on insulator (SOI), carbon doped silicon oxides, silicon nitride, doped silicon, germanium, gallium arsenide, glass, or sapphire.

The nMOS GAA devices 422A and pMOS GAA devices 422B each have a gate 404A, 404B surrounding the nanosheet structure 420A, 420B with a gate cap 406A, 406B and source/drain regions 408A, 408B on each side of the nanosheet structure 420, all of which are formed within source/drain contact trenches 434 formed on the substrate 402. For simplicity of discussion purposes, the phrase "source/drain" or "source/drain region" are used herein to describe a region of a semiconductor device formed on a substrate that includes a source region or a drain region, or both a source region and a drain region. The pMOS FET of the nanosheet structure 420B, in this example, has a first nanosheet 410B, a second nanosheet 412B, and a third nanosheet 414B which may be formed, in some embodiments, of a silicon (Si) material, which in some cases can be doped with an element such as phosphorous (P). The nMOS FET of the nanosheet structure 420A, has a first nanosheet 410A, a second nanosheet 412A, and a third nanosheet 414A which may be formed, in some embodiments, of a silicon (Si) material, which in some cases can be doped with an element such as phosphorous (P). The number of nanosheets in a stack may be more or less than the example of FIG. 4A. In some embodiments, the nanosheets may have a thickness 430 of approximately 5 nm to approximately 10 nm, such as about 6 nm. The nanosheets may be separated by inner spacers 416 composed of a dielectric material.

The source/drain regions 408A of the nMOS FET, in this example, are formed of an epitaxially grown silicon (Si) material, which in some cases can be doped with an element such as phosphorous (P). The source/drain regions 408B of the pMOS FET, in this example, are formed of an epitaxially grown silicon germanium ($Si_xGe_{1-x}$) material, where X may be from approximately 0.5 to approximately 0.95, such as between 0.5 and 0.6. In some embodiments the SiGe material may be further doped with a dopant such as boron (B) and the like.

For the sake of brevity, the formation of the partially formed GAA devices 422A, 422B as depicted in the view 400 of FIG. 4A is not discussed and is used as a starting point for the present methods. In other words, the epitaxial growth of the source/drain region material of the source/drain region 408A, 408B of the nMOS GAA device 422A and pMOS GAA device 422B, respectively, has at least been completed.

Gate-All-Around Process Sequence Example

FIGS. 4B-4D and 5A-5D illustrate an example of a cavity shaping processing sequence used to form contact regions of a semiconductor device according to one or more embodiments of the disclosure provided herein. At block 502 of method 500 a preclean process is performed on the partially formed nanosheet stack-based device structure 401, which is shown in FIG. 4B. In some embodiments, the cavity shaping process is performed on one of the MOS FET regions illustrated in FIG. 4A at a time. While not intending to limit the scope of the disclosure provided herein, in one example, blocks 502-503 are performed on the pMOS FET regions while the nMOS FET regions are isolated from the processes performed during blocks 502-503, or vice versa. However, alternately in some cases, as discussed in one or more of examples provided below, the cavity shaping process is performed on both the pMOS FET regions and nMOS FET regions simultaneously.

During block 502 the pre-clean process can be performed in a processing chamber, such as the processing chamber 122 shown in FIG. 1, or the processing chambers 200 or 300 shown in FIGS. 2A-2B and 3. The pre-clean process in block 502 may be performed without breaking vacuum in a multi-chamber processing system, such as the multi-chamber processing system 100 shown in FIG. 1.

The pre-clean process is configured to remove contaminants, such as carbon-containing contaminants (e.g., patterning residues), or oxide-containing contaminants (e.g., native oxide layers) formed on the exposed surface of the nanosheet structure 420B, which includes the exposed surfaces of the source/drain regions 408B of the pMOS FET regions. The pre-clean process may include an anisotropic remote plasma assisted dry etch process, such as a reactive ion etching (RIE) process, using a plasma formed from a gas including hydrogen (H), argon (Ar), helium (He), or a combination thereof. The pre-clean process may alternately or additionally include an isotropic plasma etch process, such as a dry chemical etch process, using anhydrous hydrofluoric acid (HF) and ammonia ($NH_3$), or a SiCoNi™ dry etch process, using a plasma formed from a gas including ammonia ($NH_3$), or nitrogen trifluoride ($NF_3$). The dry etch process is selective for oxide layers, and thus does not readily etch silicon, germanium, or nitride layers regardless of whether the layers are amorphous, crystalline or polycrystalline. Selectivity of the dry etch process for oxide versus silicon or germanium is at least about 3:1, and usually 5:1 or better, sometimes 10:1.

At block 503, a cavity shaping process is performed on the exposed portions of the source/drain regions 408B to form a contact cavity 431 within the contact trench 434, as illustrated in the partially formed device structure 451 shown in FIG. 4C1 or 4C2. The cavity shaping process may be performed in an etch chamber, such as the processing chamber 120 shown in FIG. 1, or a processing chamber 200, 300 illustrated in FIGS. 2A and 3. The cavity shaping process in method 500 may be performed without breaking vacuum in a multi-chamber processing system, such as the multi-chamber processing system 100 shown in FIG. 1. However, in some embodiments, it may be desirable to perform an ex-situ processing method in which blocks 502 and 503 are performed in a first processing system and the processes performed in block 508 are performed in a second processing system. In this case, after performing the cavity shaping process in the first processing system, the substrate is transferred to a second processing system where the processes performed during block 508 may be performed on the substrate.

In some embodiments, the cavity shaping process in block 503 includes an etch process using an etching gas including halogen-containing gas, such as chlorine ($Cl_2$), hydrogen chloride (HCl), hydrogen bromide (HBr), fluoroform ($CHF_3$), octafluorocyclobutane ($C_4F_8$), fluoromethane ($CH_3F$), or hydrogen fluoride (HF), hydrogen ($H_2$), and a carrier gas, such as include argon (Ar), or helium (He). In some embodiments, the etching gas can include a mixture of gases, such as $Cl_2/H_2$, $HBr/O_2$, $HBr/CHF_3$, $HBr/CH_3F$, $H_2/CH_3F/O_2$, or $HBr/C_4F_8/O_2$. It has been found that an etch process using chlorine ($Cl_2$) and hydrogen ($H_2$) is sensitive to the amount of germanium (Ge), and thus a cavity shaping process using these chemical components reacts differently on the n-MOS FET regions (e.g., silicon (Si)) and the p-MOS FET region (e.g., silicon germanium (SiGe)). This difference may cause a difference in deposition rates of metal material on the exposed surface 441 on the contact cavity 431 formed in the nMOS FET region (e.g., silicon (Si)) and the contact cavity 431 formed in the p-MOS FET region (e.g., silicon germanium (SiGe)) in the subsequent silicide formation processes performed during block 508. In some embodiments of the method 500, the non-chemically inert gases provided in a process gas composition used during at least a portion of a cavity shaping process 503 consists essentially of a chlorine containing gas and hydrogen ($H_2$). In one embodiment of the method 500, the non-chemically inert gases provided in a process gas composition used during at least a portion of a cavity shaping process 503 consists essentially of chlorine ($Cl_2$) and hydrogen ($H_2$).

The cavity shaping process is used to refresh and prepare pure contamination free exposed surfaces of the MOS FET cavities on which a contact (e.g., metal silicide) can be formed within the desired MOS FET region in a subsequent deposition process. The cavity shaping process is also used to optimize a device stress and increase contact area to reduce contact resistance within a formed device. The cavity shaping process may remove at least a portion of a layer of material from the surface of one or more of the MOS FET regions, such as, for example, an exposed region of the source/drain region 408B at the bottom of the contact trenches 434 (FIG. 4C1 or 4C2). In some embodiments, the shape of the surface 441 of the formed contact cavities 431 formed after the completion of block 503 include a V-shape or a U-shape that have angled sidewalls, where the center of the formed V-shape or U-shape defines the maximum depth of the formed cavity and the angled sidewalls generally extend upward from a region at the center of the formed V-shaped or U-shaped cavity. The cavity shaping process is used to enlarge a contact area between the source/drain region 408B and a contact plug that is to be formed within the second contact trench 434 to minimize parasitic resistance, leading to an improved device performance. The enlarged contact area for a contact plug formed within the contact trench 434 will minimize contact resistance without increasing a critical dimension (CD) of the contact trenches, leading to an improved device performance. As illustrated in FIG. 4C1, the lateral etching of the adjacently positioned material layers disposed within the device structure is minimal due to the highly selective etching process performed during the cavity shaping process performed during block 503. In some embodiments, the contact cavities 431 can have a width that is equal to the width of the second contact trench 434, as shown in FIG. 4C1, and have a depth of between about 2 nm and about 30 nm, such as 5 nm and about 15 nm. As illustrated in FIG. 4C2, by use of patterning, masking and/or etching process techniques lateral etching of the adjacently positioned material layers disposed within the device structure is avoided due to the formation of the contact cavities 431 within a central portion of the material used to form the source/drain region 408B during block 503. In contact cavity configurations similar to the configurations shown in FIG. 4C2, the contact cavities 431 can have a width of between about 5 nm and about 30 nm, such as about 5 nm and about 15 nm, and have a depth of between about 2 nm and about 30 nm, such as 5 nm and about 15 nm.

Figure 5D:
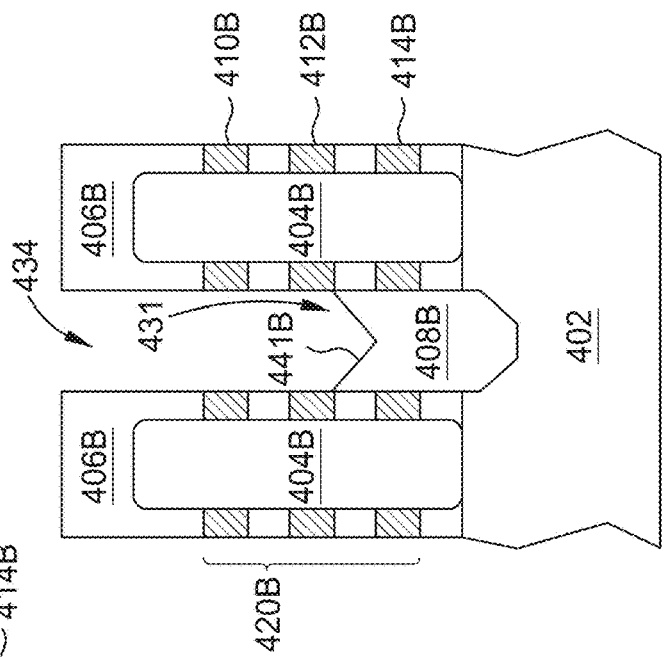
FIGS. 5B, 5C, 5D, 5E, and 5F are cross-sectional views of a portion of a semiconductor structure corresponding to various states of the method illustrated in FIG. 5A.
Figure 5C:
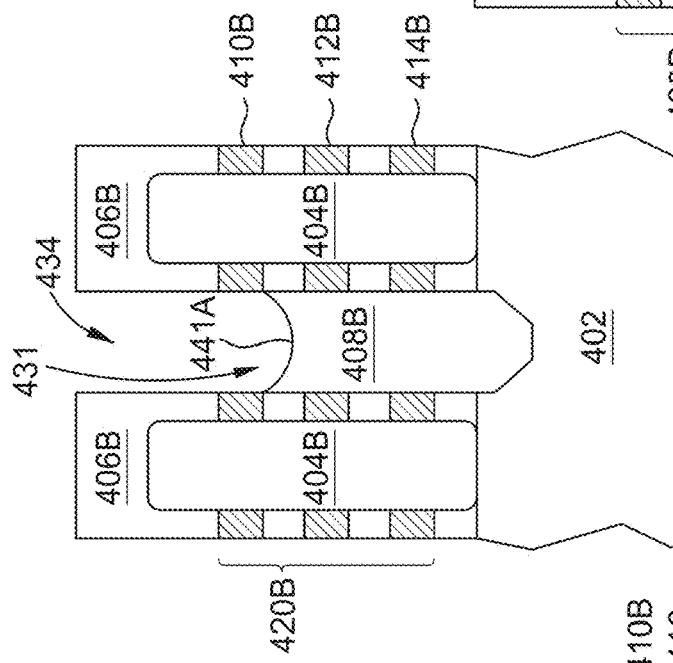
Figure 5B:
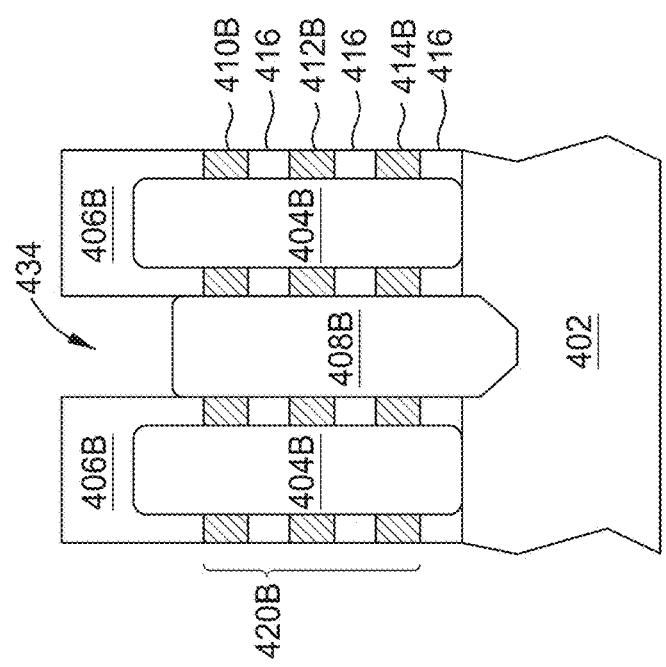

In some embodiments of block 503, the cavity shaping process includes a multistep process sequence in which two or more process steps are used to form the contact cavity 431. In one example, block 503 includes an anisotropic etch process performed in block 504 and an isotropic etching process performed in block 506. FIGS. 5B-5D are cross-sectional views of a source/drain region 408B disposed within a contact trench 434 during different portions of a multistep step cavity shaping processing sequence performed within block 503. FIG. 5B, which includes a close-up view of a portion of the nanosheet structure 420B shown in FIG. 4B, illustrates the partially formed nanosheet stack-based device after block 502 has been performed thereon.

At block 504 an anisotropic etching process is performed to etch a first portion of the source/drain region 408B. The anisotropic etching process will include a plasma etching process that can be performed in one of the processing chambers 200 or 300 illustrated in FIGS. 2A and 3, respectively. The plasma etching process can be a dry chemical etching process that includes the use of a capacitively-coupled-plasma (CCP) or an inductively-coupled-plasma (ICP) source assembly that is configured to provide a radio frequency (RF) signal to an source electrode (e.g., second gas distribution plate 266 in FIG. 2A or coils 381, 382 in FIG. 3) within the processing chamber to generate the plasma within the processing volume of the processing chamber. The RF signal applied to the source electrode can include an RF frequency greater than 100 kilohertz (kHz), equal to or greater than 2 MHZ, equal to or greater than 13.56 MHz, equal to or greater than 27 MHz, or equal to or greater than 40 MHZ. The RF signal applied to the source electrode can be delivered at a power of about 100 Watts to about 1000 Watts, such as between 150 W and 800 W, or between 150 W and 350 W. In some embodiments, the RF bias power supplied to the source electrode during block 504 can be pulsed at a desired pulsing frequency that can vary between 0.5 kHz and 1,000 kHz and have an on-time duty cycle between 10% and 95%.

The anisotropic etching process will further include the application of a bias to a substrate disposed on a substrate support to promote bombardment of the surface of the substrate by ions formed in the generated plasma. In some embodiments, the cavity shaping process performed during block 504 can include the use of a continuous or pulsed RF bias signal that is applied to the substrate by delivery of an RF signal to an electrode (e.g., items 271, 304, or 307) disposed within a substrate support 270, 336 on which the substrate is disposed. The RF signal can include an RF frequency greater than 100 kilohertz (kHz), such as equal to or greater than 2 MHZ, equal to or greater than 13.56 MHz, equal to or greater than 27 MHz, or equal to or greater than 40 MHz. The RF bias can be delivered at a power of about 5 Watts to about 500 Watts, such as between 10 W and 200 W, or between 20 W and 100 W. In some embodiments, the RF bias applied during block 504 can be pulsed at a desired pulsing frequency that can vary between 0.5 KHz and 1,000 kHz and have an on-time duty cycle between 10% and 95%.

However, in some embodiments, the cavity shaping process can include the use of a continuous or pulsed DC bias that is applied to the substrate by delivery of a DC signal to an electrode (e.g., items 271, 304 or 307) disposed within a substrate support 270, 336. The delivered DC signal can be delivered from a pulsed voltage waveform source 273, 394, 395 that includes a pulsed DC voltage power supply. In some embodiments, the pulsed DC bias includes the continuous delivery of pulses, or bursts of pulses, that include an asymmetric voltage waveform pulse that is provided at a frequency between 100 kilohertz (KHz) and 500 kHz. In one example, the pulsed voltage waveform can include applying a voltage between 100 volts and −8,000 volts at an on-time duty cycle between 10% and 95% at a pulsing frequency between 100 KHz and 500 KHz.

In some embodiments, a pulsed source power supplied to the source electrode and a pulsed substrate bias supplied to the substrate biasing electrode during block 504 are synchronized to improve the plasma properties during processing.

The cavity shaping process performed during block 504 can include the use of a first process gas mixture that includes a chlorine containing gas, such as diatomic chlorine ($Cl_2$) gas, and hydrogen ($H_2$) gas mixture, where the volume flow rate ratio of hydrogen ($H_2$) to chlorine ($Cl_2$) gas can be in a range from about 0.001:1 to about 100:1, or from about 1:1 to about 100:1, such as a ratio of about 2:1 to 50:1, or even a ratio of about 3:1 to about 20:1. In one example, the hydrogen flow rate can be from 10 to 1000 SCCM and the chlorine flow rate can be provided from about 0 SCCM to about 300 SCCM, such as from about 0.1 SCCM and about 300 SCCM. The first process gas mixture can further include argon (Ar) that is delivered at a flow rate that is from 100 to 1000 SCCM and helium (He) at a flow rate from about 100 to about 1000 SCCM.

However, in other embodiments, an alternate first process gas mixture is provided during the performance of block 504. The alternate first process gas mixture can include a mixture of gases, such as $HBr/O_2$, $HBr/CHF_3$, $HBr/CH_3F$, $H_2/CH_3F/O_2$, or $HBr/C_4F_8/O_2$. The alternate first process gas mixture can further include one or more inert gases, such as argon (Ar) and/or helium (He) at desired flow rates.

The process performed during block 504 can be performed at a first process pressure of between about 0.001 Torr to about 600 Torr, such as between about 0.05 Torr to about 50 Torr, or between about 0.01 Torr to about 0.5 Torr, or between about 0.01 Torr to about 0.1 Torr. A temperature of the substrate support and substrate can be maintained at a temperature of about −100° C. to about 200° C. during block 504. In one example, temperature of the substrate support and substrate can be maintained at a temperature of less than 30° C. during block 504.

Figure 5F:
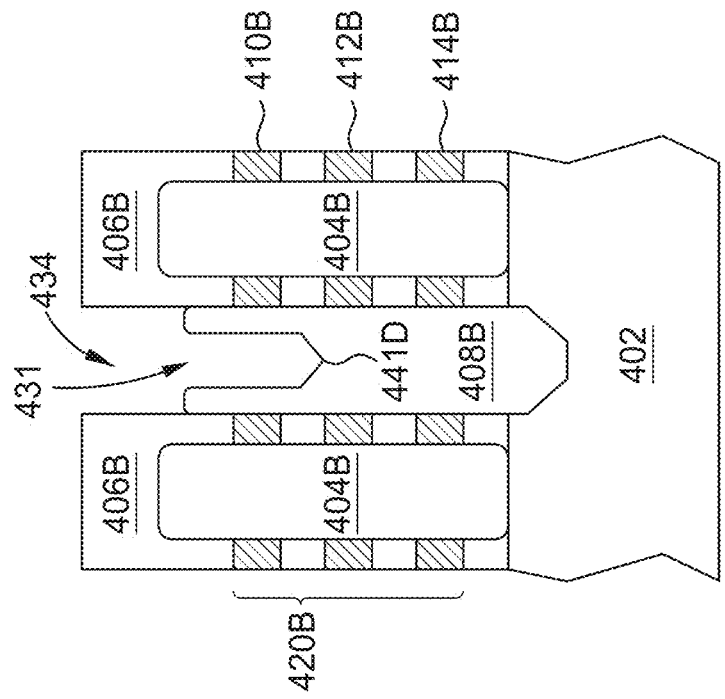
Figure 5E:
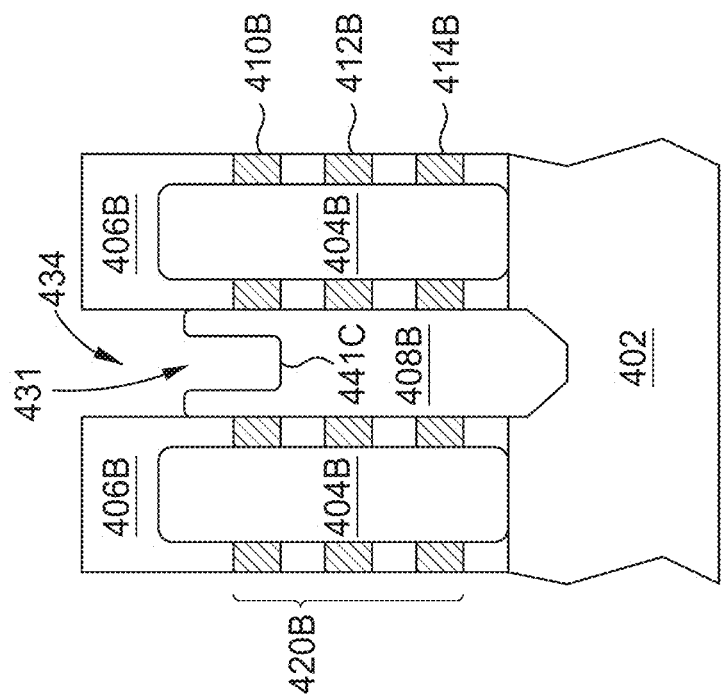

At the completion of block 504, as shown in FIG. 5C or 5E, the portion of the contact cavity formed during this step will include a generally U-shaped bottom surface 441A or 441C, respectively. Due the anisotropic nature of the process, the portion of the contact cavity formed during block 504 is predominantly formed in a vertical direction to a desired depth within the source/drain region 408B. In some embodiments, as shown in FIG. 5C, the process performed during block 504 includes etching the material of the source/drain region 408B to expose a surface of a desired number of laterally formed nanosheets (e.g., exposed surfaces within the contact trench 434), such as nanosheets 410B, 412B, 414B of the nanosheet structure 420B. In other embodiments, the process performed during block 504 includes etching only the material of the source/drain region 408B to form the first portion of the contact cavity 431 that includes, for example, the U-shaped bottom surface 441C only within the material of the source/drain region 408B.

At block 506 an isotropic etching process is performed to etch a second portion of the source/drain region 408B. The isotropic etching process can also include a plasma etching process that can be performed in processing chamber 200 or 300 illustrated in FIGS. 2A and 3, respectively. The plasma etching process can be a dry chemical etching process that can be performed in the same chamber as block 504 was performed.

In some embodiments, at block 506, the isotropic etching process will include a plasma etching process that can be performed in one of the processing chambers 200 or 300 illustrated in FIGS. 2A and 3, respectively. The plasma etching process can be a dry chemical etching process that includes the use of a capacitively-coupled-plasma (CCP) or an inductively-coupled-plasma (ICP) source assembly that is configured to provide a radio frequency (RF) signal to a source electrode within the processing chamber to generate or sustain the plasma within the processing volume of the processing chamber. The RF signal applied to the source electrode can include an RF frequency greater than 100 kilohertz (kHz), equal to or greater than 2 MHZ, equal to or greater than 13.56 MHz, equal to or greater than 27 MHz, or equal to or greater than 40 MHz. The RF signal applied to the source electrode can be delivered at a power of about 100 Watts to about 1000 Watts, such as between 150 W and 800 W, or between 150 W and 350 W. In some embodiments, the RF bias power supplied to the source electrode during block 506 can be pulsed at a desired pulsing frequency that can vary between 0.5 kHz and 1,000 KHz and have an on-time duty cycle between 10% and 95%. In some embodiments, the magnitude of the RF signal applied to the source electrode during block 506 is greater than the magnitude of the RF signal applied to the source electrode during block 504.

The isotropic etching process can include the removal of the substrate bias applied during block 504 or lowering the amount of bias applied to the substrate disposed on a substrate support during this process step. In one example, no substrate bias is applied during block 504. In some embodiments, an RF bias is applied to an electrode due to the delivery of an RF signal at an RF frequency greater than 100 kilohertz (kHz), such as equal to or greater than 2 MHZ, equal to or greater than 13.56 MHz, equal to or greater than 27 MHz, or equal to or greater than 40 MHz. The RF bias can be delivered at a power of about 0 Watts to about 500 Watts, such as between 1 W and 50 W. In some embodiments, the RF bias power applied to the substrate bias electrode can be pulsed at a desired pulsing frequency that can vary between 0.5 kHz and 1,000 kHz and have an on-time duty cycle between 10% and 95%. Alternately, in some embodiments, a pulsed voltage waveform can include applying a voltage between 10 volts and −5,000 volts at an on-time duty cycle between 10% and 95% at a pulsing frequency between 100 KHz and 500 kHz. In some embodiments, the substrate bias applied to the substrate during block 506 is less than the substrate bias applied during block 504. In some embodiments, the magnitude of the substrate bias applied to the substrate biasing electrode (e.g., items 271, 304 or 307) during block 506 is less than the magnitude of the substrate bias applied to the substrate biasing electrode during block 504. In some embodiments, a pulsed source power supplied to the source electrode and a pulsed substrate bias supplied to the substrate biasing electrode during block 506 are synchronized to improve the plasma properties during processing.

The cavity shaping process performed during block 506 includes the use of a second process gas mixture that includes a chlorine containing gas, such as diatomic chlorine ($Cl_2$) gas, and a hydrogen ($H_2$) gas mixture, where the volume flow rate ratio of hydrogen ($H_2$) to chlorine ($Cl_2$) gas can be in a range from about 0.001:1 to about 100:1, or from about 1:1 to about 100:1, such as a ratio of about 2:1 to 50:1, or even a ratio of about 3:1 to about 20:1. In one example, the hydrogen flow rate can be from 10 to 1000 SCCM and the chlorine flow rate can be provided from about 0 SCCM to about 300 SCCM, such as from about 0.1 SCCM and about 300 SCCM. The second process gas mixture can further include argon (Ar) that is delivered at a flow rate that is from 100 to 1000 SCCM and/or helium (He) at a flow rate from about 100 to about 1000 SCCM. In some embodiments, the second process gas mixture essentially includes a mixture of chlorine ($Cl_2$) gas, hydrogen ($H_2$) gas and argon (Ar) gas.

However, in other embodiments, an alternate second process gas mixture is provided during the performance of block 506. In one example, the alternate second process gas mixture can include a mixture of gases, such as $HBr/O_2$, $HBr/CHF_3$, $HBr/CH_3F$, $H_2/CH_3F/O_2$, or $HBr/C_4F_8/O_2$. In another example, the alternate second process gas mixture can include a mixture of gases, such as $HBr/H_2$, HCl, or $HCl/H_2$. The alternate second process gas mixture can further include one or more inert gases, such as argon (Ar) and/or helium (He) at desired flow rates.

The process performed during block 506 can be performed at a second process pressure of between about 0.1 Torr to about 600 Torr, such as between about 1 Torr to about 50 Torr, or between about 5 Torr to about 30 Torr. In some embodiments, the second process pressure maintained during block 506 is greater than the first process pressure maintained during block 504.

A temperature of the substrate support and substrate is maintained at a temperature of about −100° C. to about 200° C. during block 506. In one example, the temperature of the substrate support and substrate can be maintained at a temperature greater than 50° C. during block 506. In some embodiments, the temperature of the substrate during the performance of the cavity shaping process (e.g., block 503) includes performing in-situ process (e.g., single chamber process) where the temperature of the substrate during block 504 is maintained at a first processing temperature (e.g., <30° C.) and the temperature of the substrate during block 506 is maintained at a second processing temperature (e.g., >50° C.) by ramping the substrate support temperature between steps.

In some embodiments, the first process gas mixture used during block 504 comprises hydrogen ($H_2$) gas and the chlorine ($Cl_2$) gas at a gas flow rate ratio of between about 0.001:1 and 100:1, or even 1:1 and 100:1, and the second process gas mixture used during block 506 comprises hydrogen ($H_2$) gas and chlorine ($Cl_2$) gas at a gas flow rate ratio of between about 0.001:1 and 100:1, or even 1:1 and 100:1. In some embodiments, the first process gas mixture used during block 504 comprises chlorine ($Cl_2$) gas and argon (Ar) gas at a gas flow rate ratio of between about 10:1 and 1000:1, and the second process gas mixture used during block 506 comprises chlorine ($Cl_2$) gas and argon (Ar) gas at a gas flow rate ratio of between about 10:1 and 1000:1. In some embodiments, the first process gas mixture used during block 504 comprises either helium (He) or argon (Ar), or both, at a gas flow rates of between about 100 and 1000 SCCM, and the second process gas mixture used during block 506 comprises hydrogen ($H_2$) gas and the chlorine ($Cl_2$) gas at a gas flow rate ratio of between about 0.001:1 and 100:1, or even 1:1 and 100:1. In some embodiments, the first process pressure maintained in the processing volume of the process chamber during block 504 is between about 0.001 Torr and 0.1 Torr, and the second process pressure maintained in the processing volume of the process chamber during block 506 is greater than the pressure used in block 504, such as greater than 0.1 Torr, or between about 0.1 Torr and 600 Torr. In some embodiments, a first RF source power applied to a source electrode disposed in the process chamber during block 504 is between about 100 Watts and 1000 Watts, and the second RF source power applied to a source electrode disposed in the process chamber during block 506 is between about 10 Watts and 500 Watts. In some embodiments, a first RF bias power applied to a source electrode disposed in the process chamber during block 504 is between about 10 Watts and 500 Watts, and the second RF bias power applied to a source electrode disposed in the process chamber during block 506 is between about 0 Watts and 500 Watts. In some embodiments, a first processing time used to perform block 504 is between about 1 second and 60 seconds, or between 10 seconds and 60 seconds, and a second processing time used to perform block 506 is between 1 second and 80 seconds, or between 10 seconds and 80 seconds. In some embodiments, the second processing time used to perform block 506 is greater than the first processing time.

At the completion of block 506, as shown in FIG. 5D or 5F, the portion of the contact cavity formed during this step will include a generally V-shaped bottom surface 441B or 441D, respectively, that defines at least a portion of the surface 441 of the contact cavity 431. Due to the isotropic nature of the process performed during block 506, the portion of the contact cavity formed during block 506 is formed by etching the exposed surfaces of the source/drain region 408B to allow the formation a of faceted surface within the remaining material of the source/drain region 408B. In some embodiments, the process performed during block 506 includes the exposure of the (111) plane on the surface of the epitaxially grown remaining portion of the source/drain region 408B material. In some embodiments, the process performed during block 506 also includes etching the material of the source/drain region 408B to expose a surface of an additional number of laterally formed nanosheets (e.g., exposed surfaces within the contact trench 434), and also etching and faceting the exposed surfaces of the nanosheets. In other embodiments, the process performed during block 506 includes etching only the material of the source/drain region 408B to form the second portion of the contact cavity 431 that includes a desired shape, such as the V-shaped bottom surface 441D within the material of the source/drain region 408B. The V-shaped bottom surface 441D may include a subtended angle of about 50 degrees to about 75 degrees, such as about 60 degrees to about 72 degrees. However, in some contact cavity 431 configurations it may be desirable to adjust the etching process to predominantly form a U-shaped bottom surface.

Referring back to FIGS. 4D and 5A, a series of subsequent processes are performed on the formed contact cavity 431 to form a desired electrical contact structure. As illustrated in the partially formed device structure 452 shown in FIG. 4D, the subsequent processes can include the formation of one or more epitaxial layers 461 on the exposed surfaces of the remaining material in the source/drain region 408B and nanosheets, such as nanosheets 410B, 412B, 414B of the nanosheet structure 420B. Alternately or additionally the subsequent processes can include the formation of a silicide layer on the one or more epitaxially grown layers 461 or on the exposed surface of the source/drain region 408B. The processes can then further include the formation of one or more conductive layers, which can include one or more silicide layers (e.g., TiSi, MoSi, CoSi, RuSi, etc.) and/or one or more fill layers (e.g., layers comprising W, Mo, Co, Ru, or Cu) to form a metal contact 462. While FIG. 4D illustrates a metal contact 462 structure based on the contact cavity 431 shape illustrated in FIG. 4C1 this configuration is not intended to limit the scope of the disclosure provided herein since one skilled in the art would appreciate that the formation of the one or more conductive layers of a metal contact 462 can be completed within the contact cavity 431 structure illustrated in FIG. 4C2 to form an alternately configured metal contact 462. Examples of the useful series of subsequent processes are further described below.

Backside Contact Formation Process Sequence Example

Referring to FIGS. 4E-4H, some embodiments of the disclosure provided herein can be used to form a contact within a backside power delivery network (BPDN) or backside power rail (BPR) device structure. The GAA devices illustrated in FIGS. 4E-4H are provided as examples for an alternate use of the cavity shaping processing sequence described herein.

As discussed above, FIGS. 4E-4H and 5A illustrate an example of a cavity shaping processing sequence used to form contact regions through the backside surface of a substrate according to one or more embodiments of the disclosure provided herein. The cavity shaping process illustrated in FIGS. 4E-4H can be performed on one of the MOS FET regions at a time, such as the pMOS FET regions of the nanosheet structure 420B or nMOS FET regions of the nanosheet structure 420A. In one example as shown in FIGS. 4E-4H, the cavity shaping process sequence is performed on the pMOS FET regions, while the nMOS FET regions are isolated from the processes performed during method 500. However, in some embodiments, a process sequence used to form a conductive contact within the BPDN or BPR devices can include the cavity shaping process being performed within both the pMOS FET regions and nMOS FET regions simultaneously. Alternately, the cavity shaping process is performed on the nMOS FET regions, while the pMOS FET regions are isolated from the processes performed during method 500.

At block 502 of method 500 a feature opening and preclean process is performed on a partially formed nanosheet stack-based device. FIG. 4E illustrates a partially formed nanosheet stack-based device structure 401 prior to the completion of the feature opening and preclean process performed during block 502. The 402 During block 502, as described above, a feature opening and pre-clean process can be performed in a processing chamber, such as the processing chamber 122 shown in FIG. 1, or one of the processing chambers 200 or 300 shown in FIGS. 2A-2B and 3. The feature opening and pre-clean process in block 502 may be performed without breaking vacuum environment in a multi-chamber processing system, such as the multi-chamber processing system 100 shown in FIG. 1.

During a BPDN or BPR device contact formation process sequence, block 502 of method 500 will include the formation of a plurality of openings 445 within the substrate 402 as shown in the partially formed device structure 455 in FIG. 4F. The plurality of openings 445 are formed from the backside of the substrate (e.g., silicon (Si) and/or dielectric containing substrate (e.g., $SiO_2$)) by a patterning process. The plurality of openings 445 are aligned with and are in contact with a lower portion of the formed source/drain regions of the formed device structure 455 formed on the front side of the substrate, such as the source/drain region 408B for example. In one example, the plurality of openings 445 can be formed by use of conventional through-silicon via (TSV) etching process, such as a "Bosch" etching process that can include a multi-step etching process, which can include a cyclic first isotropic etching step using a plasma generated halide containing gas (e.g., $SF_6$) and a second passivation layer deposition step.

Referring to FIG. 4G1 or 4G2, at block 503, a cavity shaping process is performed on the exposed portions of the source/drain regions 408B exposed within each of the plurality of openings 445 to form a contact cavity 431 within the openings 445 of the partially formed device structure 455. The cavity shaping process may be performed in an etch chamber, such as the processing chamber 120 shown in FIG. 1, or processing chamber 200, 300 illustrated in FIGS. 2A and 3. The cavity shaping process in this version of method 500 may be performed without breaking vacuum environment in a multi-chamber processing system, such as the multi-chamber processing system 100 shown in FIG. 1. However, in some embodiments, it may be desirable to perform an ex-situ processing method in which blocks 502 and 503 are performed in a first processing system and the processes performed in block 508 are performed in a second processing system. In this case, after performing the cavity shaping process in the first processing system, the substrate is transferred to a second processing system where the processes performed during block 508 may be performed on the substrate.

FIGS. 4G1 and 4G2 illustrate the formed contact cavities 431 after a single step cavity shaping process or a multiple step cavity shaping processes described above in relation to block 503 have been performed on the partially formed device structure 456. In some embodiments of block 503, the cavity shaping process includes a multistep process sequence in which two or more process steps are used to form the contact cavities 431. In one example, block 503 includes an anisotropic etch process performed in block 504 and an isotropic etching process performed in block 506 that is performed from the backside of the substrate 402 and through the openings 445.

Referring to FIGS. 4H and 5C, a series of subsequent processes are performed on the formed contact cavities 431 to form a desired electrical contact structure. As shown in FIG. 4H, the subsequent processes can include the formation of one or more epitaxial layers 448 on the exposed surfaces of the remaining material in the source/drain region 408B within the partially formed device structure 457. Alternately or additionally the subsequent processes can include the formation of a silicide layer on the one or more epitaxially grown layers 448 or on the exposed surface 441 of the source/drain region 408B. The processes can then further include the formation of one or more conductive layers 447, which can include one or more silicide layers and/or one or more fill layers to form a metal contact 446. While FIG. 4H illustrates a metal contact 446 structure based on the contact cavity 431 shape illustrated in FIG. 4G1 this configuration is not intended to limit the scope of the disclosure provided herein since one skilled in the art would appreciate that the formation of the one or more conductive layers 447 of a metal contact 446 can be completed within a contact cavity 431 structure illustrated in FIG. 4G2 to form an alternately configured metal contact 446. Examples of the useful series of subsequent processes are further described below.

Device Formation Sequence Examples

Figure 6:
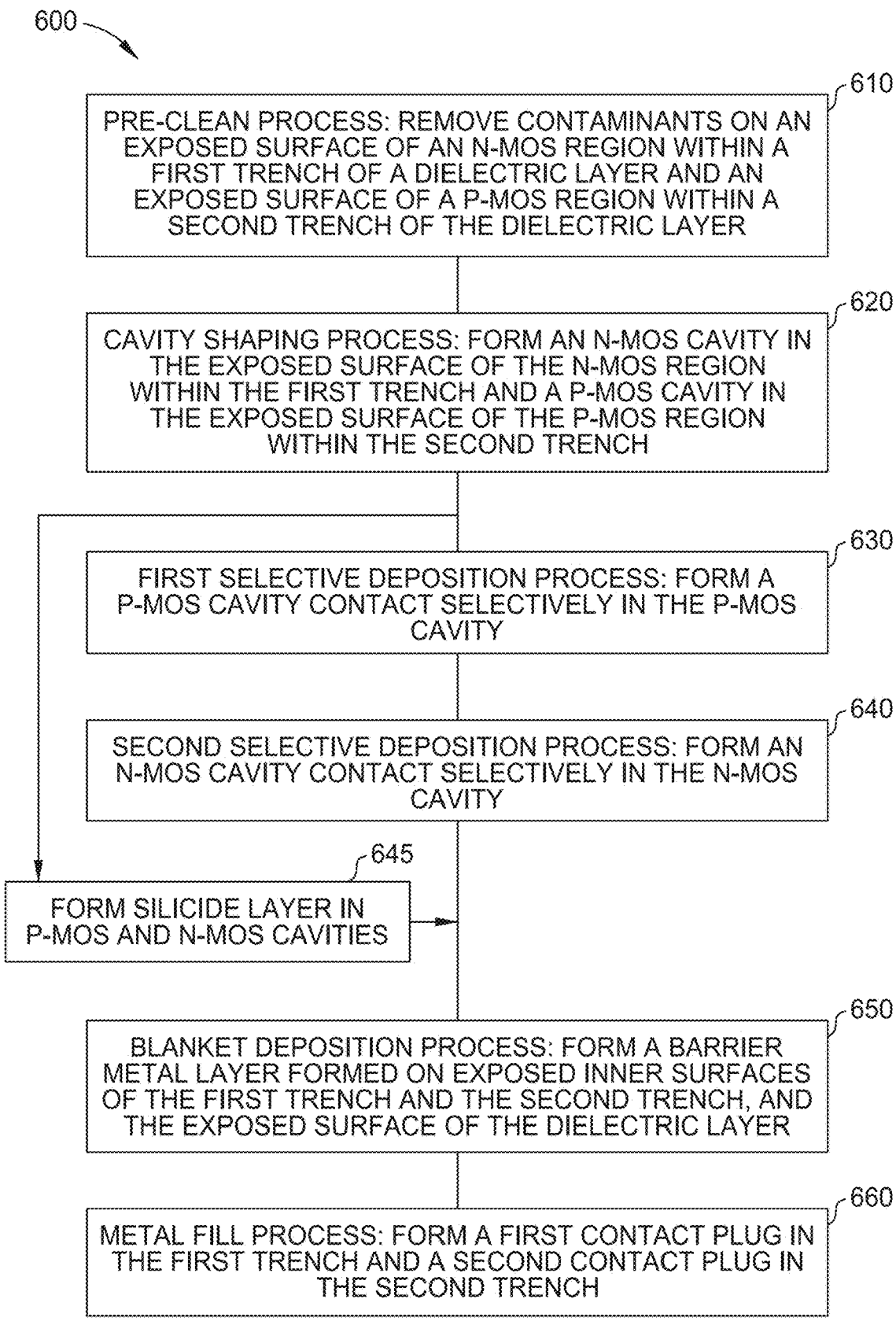
FIG. 6 depicts a process flow diagram of a method of forming a contact layer in a semiconductor structure, according to one or more embodiments of the present disclosure.

FIG. 6 depicts a process flow diagram of a method 600 of forming a contact layer in a semiconductor structure 700 according to some embodiments of the present disclosure. FIGS. 7A, 7B, 7C, 7D, 7E, and 7F are cross-sectional views of a portion of the semiconductor structure 700 corresponding to various states of the method 600. It should be understood that FIGS. 7A, 7B, 7C, 7D, 7E, and 7F illustrate only partial schematic views of the semiconductor structure 700, and the semiconductor structure 700 may contain any number of transistor sections and additional materials having aspects as illustrated in the figures. It should also be noted that although the method illustrated in FIG. 6 is described sequentially, other process sequences that include one or more operations that have been omitted and/or added, and/or has been rearranged in another desirable order, fall within the scope of the embodiments of the disclosure provided herein.

Referring to FIGS. 7A, 7B, 7C, 7D, 7E, and 7F, the semiconductor structure 700 may include an n-type MOS device 702 and a p-type MOS device 704 formed on a substrate (not shown). For simplicity of discussion and illustration the nMOS GAA device 422A and pMOS GAA device 422B structures described above have been simplified and are illustrated and described in the disclosure below as an n-type MOS device 702 that includes a single contact trench 712 within an n-MOS region 706 and a p-type MOS device 704 that includes a single contact trench 714 within a p-MOS region 708, respectively. As discussed above, the device structures illustrated and described herein are not intended to limit the scope of the disclosure provided herein since other devices and device configurations can benefit from one or more of the embodiments disclosed herein.

Figure 7A:
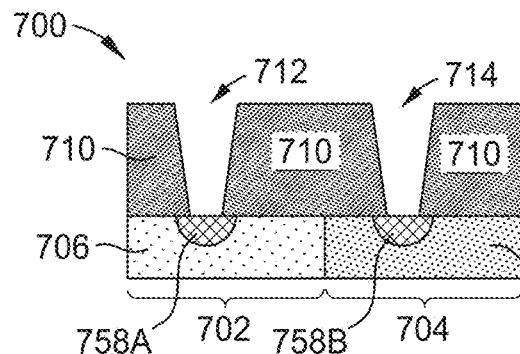
FIGS. 7A-7F are cross-sectional views of a portion of a semiconductor structure corresponding to various states of the method illustrated in FIG. 6.

As shown in FIG. 7A, a portion of an n-type MOS device 702 of a plurality of n-type transistor devices formed on the substrate includes an n-type metal oxide semiconductor (n-MOS) region 706 that includes a source/drain region 758A formed of a first material, such as silicon (Si). A portion of a p-type MOS device 704 of a plurality of p-type transistor devices formed on the substrate includes a p-MOS region 708 that includes a source drain region 758B formed of a second material, such as silicon germanium (SiGe). The source/drain regions 758A and 758B illustrated in FIGS. 7A-7I can comprise the source/drain regions 408A, 408B, which are described above. The n-type MOS device 702 and the p-type MOS device 704 can both form part of a CMOS device of a plurality of CMOS devices formed on a substrate. The first and second materials include materials having differing compositions, such that the second material can be selectively etched relative to the first material (i.e., an etch rate of the second material is higher than an etch rate of the first material). The etch selectivity of the second material (i.e., a ratio of the etch rate of the second material to the etch rate of the first material) is between about 10:1 to 500:1. Other example combinations of the first material and the second material include silicon (Si)/silicon germanium (SiGe), germanium (Ge)/silicon germanium (SiGe), or silicon (Si)/germanium tin (GeSn), respectively.

The source/drain region 758A of the n-MOS region 706 may be doped with n-type dopants such as phosphorus (P), antimony (Sb), with the concentration between about $10^{20}$ $cm^{-3}$ and $5\cdot\times10^{21}$ $cm^{-3}$, depending upon the desired conductive characteristic of the n-type MOS device 702. The source/drain region 758B of the p-MOS regions 708 may be doped with p-type dopants such as boron (B) or gallium (Ga), with the concentration of between about $10^{20}$ $cm^{-3}$ and about $5\cdot\times10^{21}$ $cm^{-3}$, depending upon the desired conductive characteristic of the p-type MOS device 704.

The semiconductor structure 700 further includes a dielectric layer 710 having a first trench 712 formed over the n-MOS region 702 and a second trench 714 formed over the p-MOS region 704. In one example, the dielectric layer 710 may be formed of a dielectric material, such as silicon dioxide ($SiO_2$) or silicon nitride ($Si_3N_4$).

The source/drain region 758A and the source/drain region 758B may be formed using any suitable deposition technique, such as epitaxial (Epi) deposition, chemical vapor deposition (CVD), atomic layer deposition (ALD), or physical vapor deposition (PVD), and the first and second contact trenches 712 and 714 are formed by a patterning technique, such as a lithography and etch process.

The method 600 begins with a pre-clean process in block 610. The pre-clean process may be performed in a processing chamber, such as the processing chamber 122 shown in FIG. 1, or one of the processing chamber 200 or 300 shown in FIGS. 2A and 3. The pre-clean process in block 610 may be performed without breaking vacuum environment in a multi-chamber processing system, such as the multi-chamber processing system 100 shown in FIG. 1.

The pre-clean process is configured to remove contaminants, such as carbon-containing contaminants (e.g., patterning residues), or oxide-containing contaminants (e.g., native oxide layers) formed on the exposed surface of the n-MOS region 706 within the first trench 712 and the exposed surface of the p-MOS region 708 within the second trench 714.

The pre-clean process performed during block 610 includes the processes and chemistries described above in relation to block 502 of method 500. The pre-clean process may include an anisotropic plasma assisted dry etch process, such as a reactive ion etching (RIE) process, using a plasma formed from a gas including hydrogen (H), argon (Ar), helium (He), or a combination thereof.

Figure 7B:
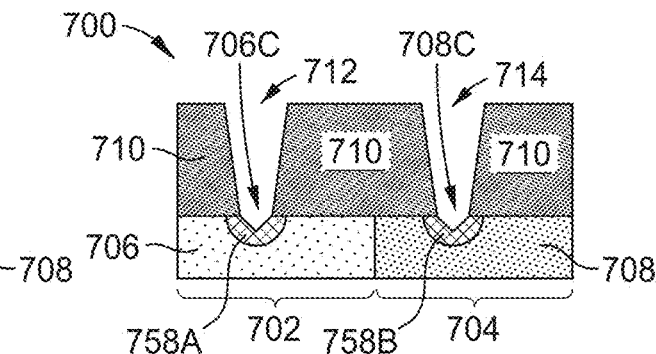

In block 620, a cavity shaping process is performed to form an n-MOS cavity 706C in the exposed surface of the source/drain region 758A of the n-MOS region 706 within the first trench 712 and a p-MOS cavity 708C in the exposed surface of the source/drain region 758B of the p-MOS region 708 within the second trench 714, as shown in FIG. 7B. The cavity shaping process may be performed by use of the processes and chemistries described above in relation to block 503 of method 500. In some embodiments, the cavity shaping process includes performing a multistep process that includes the processes described in relation to blocks 504 and 506 of method 500.

The cavity shaping process in block 620 may be performed without breaking vacuum environment in a multi-chamber processing system, such as the multi-chamber processing system 100 shown in FIG. 1. However, in some embodiments, it may be desirable to perform an ex-situ processing method in which blocks 610 and 620 are performed in a first processing system and blocks 630-660 are performed in a second processing system. In this case, after performing the cavity shaping process in the first processing system, the substrate is transferred to a second processing system where the processes performed during block 610 may be performed again on the substrate before the next operation is performed on the substrate (e.g., block 630).

Figure 7C:
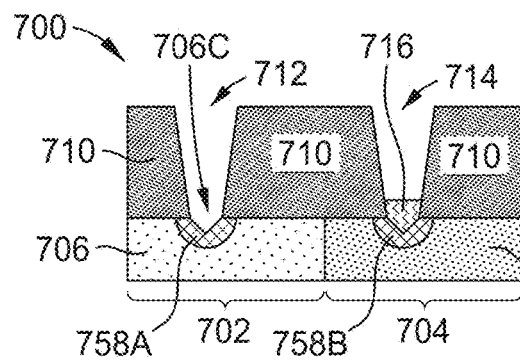
Figure 7D:
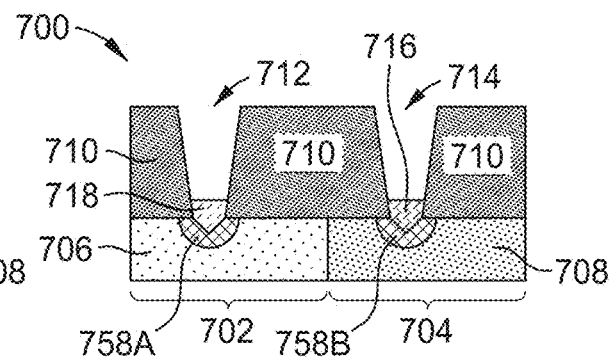
Figure 7E:
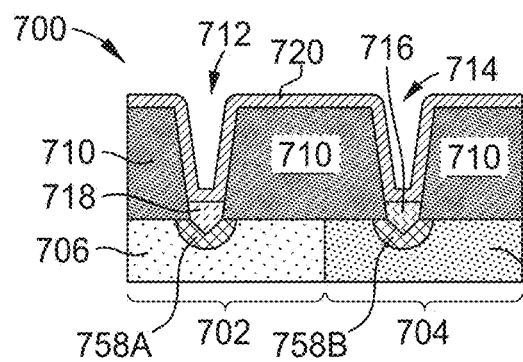
Figure 7F:
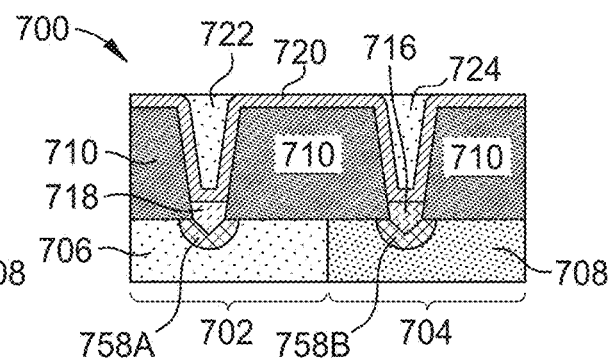
Figure 7G:
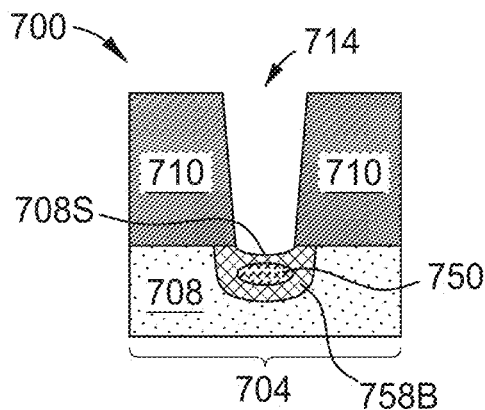
FIGS. 7G and 7H are cross-sectional views of a portion of a semiconductor structure corresponding to various states of the method illustrated in FIG. 6.

In some embodiments block 620 of method 600, as shown in FIG. 7G, in an effort to adjust and/or further control the shape of one or more of the formed cavities an implanted region 750 can be formed at the bottom of at least one of the trenches 712 and 714. In one embodiment, an implanted region 750 can be doped with one or more metal dopants, such as gallium (Ga), which will also reduce the contact resistance between the implanted MOS region and the contact plug within the contact trench. In some embodiments, the implanted region can be formed in either the n-MOS cavity 706C or the p-MOS cavity 708C, or in both. In one example, as shown in FIG. 7G, an implanted region 750 is formed through the surface 708S of a source/drain region 758B of a p-MOS region 708. In some embodiments, the dopant implanting process is performed in a PVD chamber, such as the processing chamber 126, 128, or 130 shown in FIG. 1, by directing ions of metal dopants, such as gallium (Ga), to the exposed surface 708S of the source/drain region 758B of the p-MOS region 708 within the contact trench 714. The implanted region 750 may be doped with metal dopants, such as gallium (Ga), with the concentration between about $5\times10^{19}$ $cm^{-3}$ and $5\times10^{21}$ $cm^{-3}$, and located at a depth of between about 2 nm and about 10 nm from the surface 708S of the source/drain region 758B. The ion implantation process can be directional and thus the location of the implanted region 750 within the p-MOS region 708 can be adjusted. The dopant implanting process is typically followed by an anneal process to recrystallize the implanted region 750 of the p-MOS region 708. The annealing process is performed at a temperature of about 600° C. to about 850° C., for a duration of about 0.1 milliseconds to about 0.5 milliseconds.

Figure 7H:
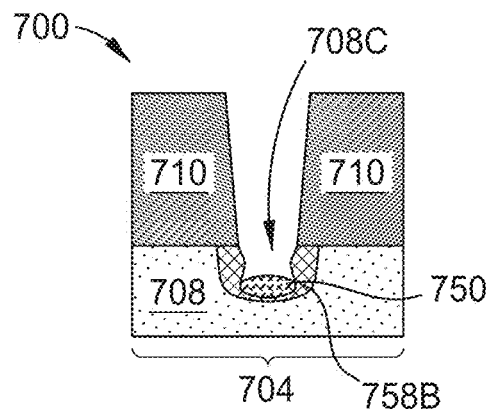

After the implantation process has been performed, the etch process of block 620 can be performed to form a cavity, as shown in FIG. 7H. It has been found that, depending on the shape and the location of an implanted region in the MOS region, width and depth of a formed cavity can be modulated to better control the formed shape and surface area of the cavity 708C. By selecting a desired type of dopant (e.g., metal dopant) and desired implant parameters, the shape of the formed cavity during block 620 can be adjusted to achieve either a more U-shaped cavity versus a V-shaped cavity, for example.

In block 630, a first selective contact deposition process is performed to form a p-MOS cavity contact 716 selectively on the remaining portion of the source/drain region 758B in the p-MOS cavity 708C, as shown in FIG. 7C. The first selective deposition process may be performed in a processing chamber, such as the processing chamber 126, 128, or 130 shown in FIG. 1. The first selective contact deposition process in block 630 may be performed without breaking vacuum environment in a multi-chamber processing system, such as the multi-chamber processing system 100 shown in FIG. 1. However, as noted above, in some configurations where the cavity shaping process is performed in another tool (e.g., ex-situ processing), the subsequent processing operations of method 600 can be performed in a multi-chamber processing system, where block 610 is performed prior to continuing on with the subsequent operations.

The p-MOS cavity contact 716 may be formed of a first metal material, such as molybdenum (Mo), ruthenium (Ru), or silicide thereof. The p-MOS cavity contact 716 interfaces with the source/drain region 758B of the p-MOS region 708 and a contact plug to be formed within the second trench 714, and provides an electrical connection therebetween.

In some embodiments, the first selective deposition process includes a deposition process, such as chemical vapor deposition (CVD), physical vapor deposition (PVD), or the like. The selectivity in the first selective deposition process may arise from differences in reactions of a deposition precursor of the first metal material (e.g., molybdenum (Mo), ruthenium (Ru)) with the exposed surface of the n-MOS cavity 706C (e.g., silicon (Si), passivated silicon (Si) surface) formed in the source/drain region 758A and the exposed surface of the p-MOS cavity 708C (e.g., silicon germanium (SiGe)) formed in the source/drain region 758B. During the deposition process, the deposition precursor reacts preferentially with the exposed surface of the p-MOS cavity 708C (e.g., silicon germanium (SiGe)) to the exposed surface of the n-MOS cavity 706C (e.g., silicon (Si), passivated silicon (Si) surface), and thus growth of the first metal material may occur at a faster rate on the exposed surface of the p-MOS cavity 708C than the exposed surface of the n-MOS cavity 706C.

In some embodiments, a deposition gas used in the deposition process includes a metal source, such as a molybdenum (Mo)-containing halide precursor, or a ruthenium (Ru)-containing organometallic that includes ruthenium (Ru). The first selective deposition process may be performed at a temperature of between about 240° C. and about 450° C. and at a pressure of between 3°Torr and 300° Torr. During the deposition process, argon (Ar) gas may be supplied at a flow rate of between about 0 sccm and about 1000 sccm, and hydrogen ($H_2$) gas may be supplied at a flow rate of between about 500 sccm and about 15000 sccm, for example.

A cycle of the first selective deposition process may be repeated as needed to obtain a desired thickness of the p-MOS cavity contact 716, for example, between about 5 times and about 1000 times.

In block 640, a second selective contact deposition process is optionally performed to form an n-MOS cavity contact 718 selectively in the n-MOS cavity 706C formed in the source/drain region 758A, as shown in FIG. 7D. The second selective contact deposition process may be performed in a processing chamber, such as the processing chamber 126, 128, or 130 shown in FIG. 1. The second selective contact deposition process in block 640 may be performed without breaking vacuum environment in a multi-chamber processing system, such as the multi-chamber processing system 100 shown in FIG. 1.

The n-MOS cavity contact 718 may be formed of a second metal material, such as titanium (Ti), cobalt (Co), nickel (Ni), tantalum (Ta), lanthanum (La), yttrium (Y), hafnium (Hf), zirconium (Zr), or silicide thereof. The n-MOS cavity contact 718 interfaces with the source/drain region 758A of the n-MOS region 706 and a contact plug to be formed within the first trench 712, and provides an electrical connection therebetween.

In some embodiments, the second selective contact deposition process includes a deposition process, such chemical vapor deposition (CVD), physical vapor deposition (PVD), or the like. The selectivity in the second selective contact deposition process may arise from differences in reactions of a deposition precursor of the second metal material (e.g., titanium (Ti)) with the exposed surface of the n-MOS cavity 706C (e.g., silicon (Si)) and the exposed surface of the p-MOS cavity contact 716 (e.g., molybdenum (Mo), ruthenium (Ru)). During the deposition process, the deposition precursor reacts preferentially with the exposed surface of the n-MOS cavity 706C (e.g., silicon (Si)) to the exposed surface of the p-MOS cavity contact 716 (e.g., molybdenum (Mo), ruthenium (Ru)), and growth of the second metal material may occur at a faster rate on the exposed surface of the n-MOS cavity 706C than the exposed surface of the p-MOS cavity contact 716 (e.g., molybdenum (Mo), ruthenium (Ru)).

In some embodiments, a deposition gas used in the deposition process includes a metal source, such as a precursor containing titanium (Ti), tantalum (Ta), cobalt (Co), nickel (Ni), combination thereof. The second selective deposition process may be performed at a temperature of between about 300° C. and about 800° C. and at a pressure of between 1° Torr and 50° Torr.

Figure 7I:
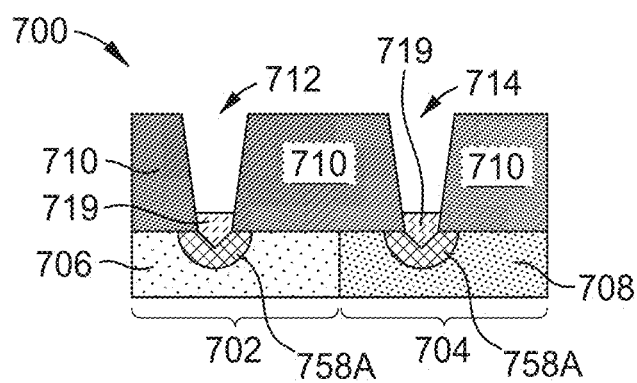
FIG. 7I is a cross-sectional view of a portion of a semiconductor structure corresponding to a state of the method illustrated in FIG. 6.

In an alternate version of method 600, the processing sequence includes the performance of a contact deposition process that includes a silicide formation process performed in block 645. The silicide formation process is used to form one or more silicide layers 719 within the n-MOS cavity 706C and/or the p-MOS cavity 708C as shown in FIG. 7I. In some embodiments, the silicide formation process performed in block 645 includes a deposition process, such as chemical vapor deposition (CVD), physical vapor deposition (PVD), or the like that non-selectively forms on the contact surface of the n-MOS cavity 706C and p-MOS cavity 708C. In some embodiments, the deposition process is a thermal-CVD or PECVD deposition process that is performed at a temperature of between about 300° C. and about 800° C. and at a pressure of between 1°Torr and 50° Torr and by use of a precursor containing titanium (Ti), cobalt (Co), nickel (Ni), tantalum (Ta), lanthanum (La), yttrium (Y), hafnium (Hf), and/or zirconium (Zr). The silicide formation process 645 may include the formation of a metal silicide, such as a titanium silicide ($TiSi_x$), a cobalt silicide ($CoSi_x$), a zirconium silicide ($ZrSi_x$), a hafnium silicide ($HfSi_x$), a nickel platinum silicide ($NiPtSi_x$), or other useful silicide layer that can be formed on the surface of the n-MOS cavity 706C (e.g., silicon (Si), passivated silicon (Si) surface) and/or on the exposed surface of the p-MOS cavity 708C (e.g., silicon germanium (SiGe) surface). The silicide formation process of block 645 may be performed without breaking vacuum environment in a multi-chamber processing system, such as the multi-chamber processing system 100 shown in FIG. 1. However, as noted above, in some configurations where the cavity shaping process is performed in another tool (e.g., ex-situ processing), the subsequent processing operations of method 600 can be performed in a multi-chamber processing system, where block 610 is performed prior to continuing on with the subsequent operations.

In block 650, a blanket deposition process is optionally performed to form a barrier metal layer 720 on the exposed inner surfaces of the first trench 712 and the second trench 714, and the exposed surface of the dielectric layer 710, as shown in FIG. 7E. The barrier metal layer 720 protects the p-MOS cavity contact 716 and the n-MOS cavity contact 718 and allows nucleation and growth of contact plugs in the first trench 712 and the second trench 714. The barrier metal layer 720 may be formed of a barrier metal material that is titanium nitride (TiN), or tantalum nitride (TaN). In some embodiments, the n-MOS cavity contact 718 is a silicide layer that is formed from a portion of the barrier metal layer 720 by use of a spike anneal process. The blanket deposition process in block 650 may be performed without breaking vacuum environment in a multi-chamber processing system, such as the multi-chamber processing system 100 shown in FIG. 1.

In block 660, a metal fill process is performed to form a first contact plug 722 in the first trench 712 and a second contact plug 724 in the second trench 714, as shown in FIG. 7F. The first contact plug 722 and the second contact plug 724 may be formed of contact plug metal material, such as tungsten (W), cobalt (Co), ruthenium (Ru), or molybdenum (Mo). The first contact plug 722 and the second contact plug 724 may include a metal that has a desirable work function. The metal fill process in block 660 may include a chemical vapor deposition (CVD) process using a tungsten-containing precursor, such as $WF_6$, or a cobalt-containing precursor, in a processing chamber, such as the processing chamber 126, 128, or 130 shown in FIG. 1.

After the metal fill process, the semiconductor structure 700 may be planarized, by use of a chemical mechanical planarization (CMP) process.

Figure 8:
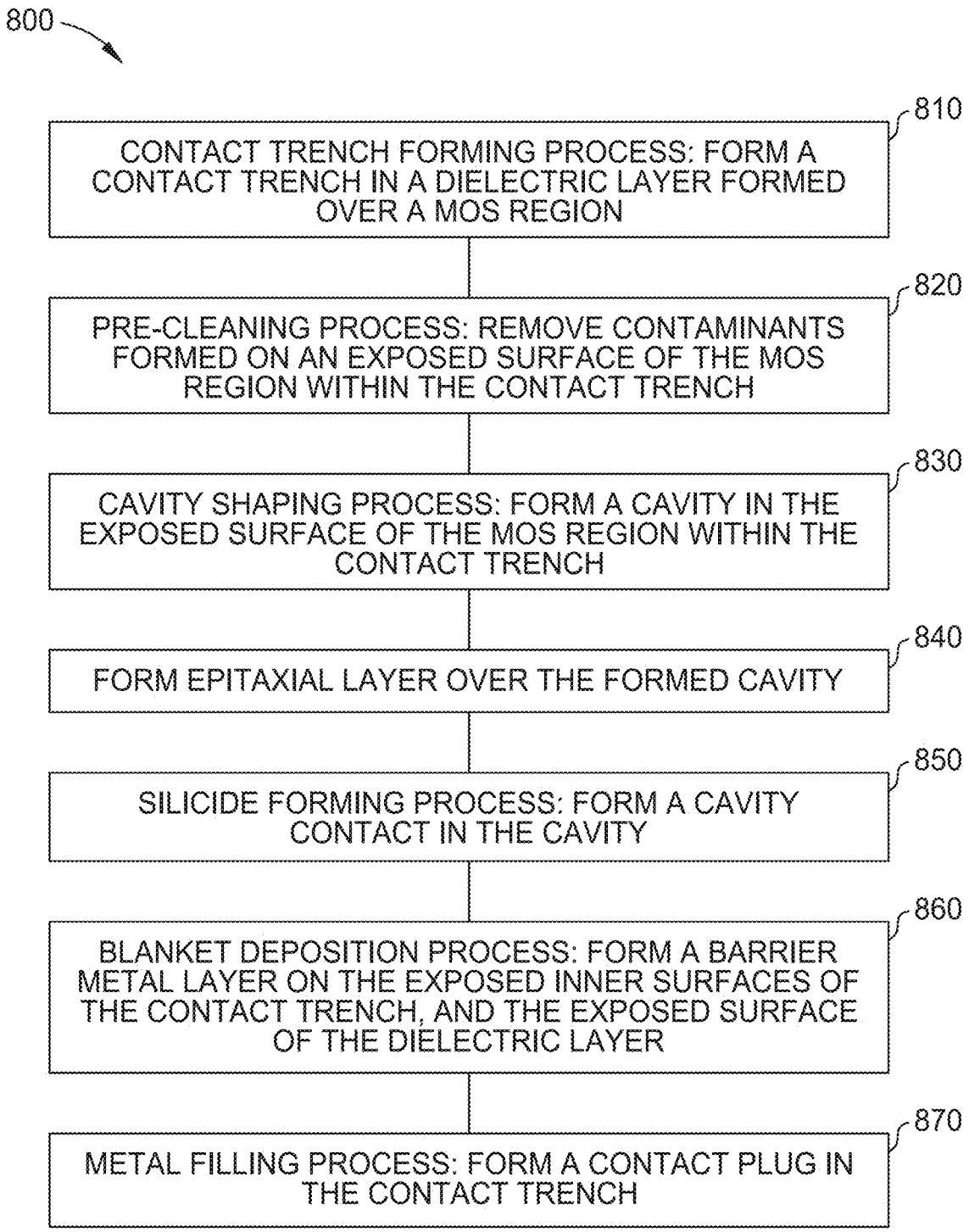
FIG. 8 depicts a process flow diagram of a method of forming a contact layer in a semiconductor structure, according to one or more embodiments of the present disclosure.

In one of the embodiments described herein a method and system for forming an electrical contact that includes metal silicide (e.g. molybdenum silicide ($MoSi_2$), ruthenium silicide ($Ru_xSi_y$)) within a contact trench on a selected portion of a transistor structure is provided. The contact trench structure includes a metal contact plug formed within a contact trench between adjacent device modules, and electrical contacts that interface between the contact plug and silicon-based channels in the device modules, reducing parasitic resistance. The electrical contacts are formed in this process sequence by a selective deposition process. The electrical contact may include metal silicide (e.g. molybdenum silicide ($MoSi_2$), ruthenium silicide ($Ru_xSi_y$)) selectively formed in a contact trench in a p-type MOS device (e.g., silicon germanium), or metal silicide (e.g., titanium silicide (Ti $Si_2$)) selectively formed in a contact trench in an n-type MOS device. Due to the cavity shaping process according to the embodiments described herein, to form a cavity within the contact trench, a contact interface area is increased and exposed surfaces of the cavity are optimized for selective deposition of metal silicide within the cavity.
Alternate Processing Method Example FIG. 8 depicts a process flow diagram of a method 800 of forming a contact layer in a semiconductor structure 900 according to an embodiment of the present disclosure. In this contact layer formation process sequence, an epitaxial layer is formed over one or more contact regions (e.g., n-MOS region 706 and/or p-MOS region 708) after the contact shaping process has been performed. The same reference numerals are used for the components that are substantially the same as those of the prior discussed embodiment, and the description of repeated components may be omitted. FIGS. 9A, 9B, 9C, 9D, 9E, and 9F are cross-sectional views of a portion of the semiconductor structure 900 corresponding to various states of the method 800. It should be understood that FIGS. 9A, 9B, 9C, 9D, 9E, and 9F illustrate only partial schematic views of the semiconductor structure 900, and the semiconductor structure 900 may contain any number of transistor sections and additional materials having aspects as illustrated in the figures. It should also be noted that although the method illustrated in FIG. 9 is described sequentially, other process sequences that include one or more operations that have been omitted and/or added, and/or has been rearranged in another desirable order, fall within the scope of the embodiments of the disclosure provided herein.

Figure 9A:
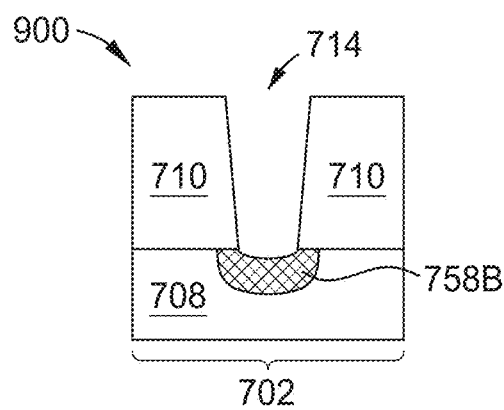
FIGS. 9A-9F are cross-sectional views of a portion of a semiconductor structure corresponding to various states of the method of FIG. 8.

The method 800 begins with block 810, in which a source/drain contact trench forming process is performed to form one or more contact trenches on a substrate, as shown in FIG. 9A. In some embodiments of method 800, the processes performed in block 810 only include the formation and processing of one of the contact trench types at a time (e.g., p-MOS trench) as illustrated in FIG. 9A versus forming and processing both of the contact trench types (e.g., p-MOS trench and n-MOS trench) simultaneously as illustrated in FIGS. 7A-7F. While not intending to limit the scope of the disclosure provided herein, in one example, a contact trench 714 is first formed in a dielectric layer 710 over the p-MOS region 708 as shown in FIG. 9A.

In block 820, a pre-cleaning process is performed to remove contaminants, such as carbon-containing contaminants (e.g., patterning residues), or oxide-containing contaminants (e.g., native oxide layers) formed on the exposed surface of the source/drain region 758B of the p-MOS region 708 within the contact trench 714. The pre-cleaning process in block 820 is similar to or the same as the pre-cleaning process in blocks 502 and 610 described above.

Figure 9B:
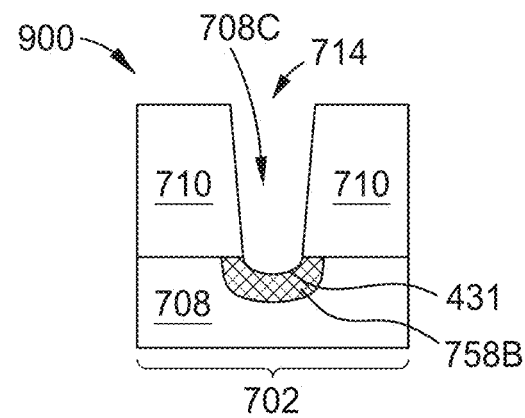

In block 830, a cavity shaping process is performed to form a cavity 708C in the exposed surface of the source/drain region 758B of the p-MOS region 708 within the contact trench 714, as shown in FIG. 9B. The cavity shaping process in block 830 is similar to or the same as the cavity shaping process in block 503 described above. In one embodiment of the method 800, the dopant implanting process is performed during the cavity shaping process, and thus the shape of the cavity 912 in the p-MOS region 708 can be adjusted based on the doping profile of the implant process. However, in other embodiments, the implant process is not performed during block 620, and thus the shape of the cavity 912 is determined by the etch process performed during block 503. In some embodiments, the cavity shaping process includes performing a multistep process that includes the processes described in relation to blocks 504 and 506 of method 500.

Figure 9C:
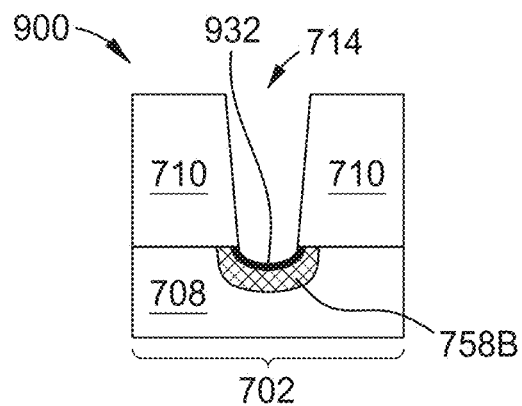

In block 840, a first selective epitaxial layer deposition process is performed to form an epitaxial layer 932 selectively on the surface of the p-MOS cavity 708C, as shown in FIG. 9C. The first selective deposition process may be performed in a processing chamber, such as the processing chamber 126, 128, or 130 shown in FIG. 1. The first selective deposition process in block 840 may be performed without breaking vacuum environment in a multi-chamber processing system, such as the multi-chamber processing system 100 shown in FIG. 1. However, as noted above, in some configurations where the cavity shaping process is performed in another tool (e.g., ex-situ processing), the subsequent processing operations of method 800 can be performed in a multi-chamber processing system, where block 820 is performed prior to continuing on with the subsequent operations, such as blocks 840-870.

At block 840, the contact trench 714 is exposed to a material forming precursor to selectively form the epitaxial layer 932 on the bottom surface of the contact cavity 431 within the trench 714, as shown in FIG. 9C. The epitaxial layer 932 may include any suitable semiconductor materials, for example doped or undoped group IV-containing material, compound semiconductor materials such as III-V materials, or any suitable materials that may be used to improve transistor performance. In one implementation, the epitaxial layer 932 includes silicon. The epitaxial layer 932 is formed as an interface between the source/drain region 758B of the p MOS region 708 and a metal contact plug that is to be formed within the contact trench 714, to minimize parasitic resistance.

In some embodiments, the epitaxial layer 932 is formed of a third material. Examples of the third material include silicon germanium (SiGe) with a ratio of germanium (Ge) ranging between 20% and 100%, for example, between about 60% and about 80%, between about 60% and about 100%, or between about 80% and about 100%. If desired, one or more dopant gases may be introduced into the processing chamber to provide the epitaxial layer with desired conductive characteristic and various electric characteristics, such as directional electron flow in a controlled and desired pathway required by the electronic device. Exemplary dopant gases may include, but are not limited to phosphorous (P), boron (B), gallium (Ga), or aluminum (Al), depending upon the desired conductive characteristic of the deposited epitaxial layer. The epitaxial layer 932 may be doped with p-type dopants such as boron (B) or gallium (Ga) and may have a thickness between about 1 and 20 nanometers (nm), such as between 5 and 15 nm. In one example, the formed epitaxial layer comprises a boron doped silicon germanium layer (SiGe:B) with the concentration of between about $10^{20}$ cm$^{-3}$ and $5\times 10^{21}$ cm$^{-3}$, depending upon the desired conductive characteristic of the contact layer 920. If a germanium-containing epitaxial layer is desired for the epitaxial layer 932, a gas mixture comprising a germanium-containing precursor may be introduced into the processing chamber. The gas mixture may further contain the silicon-containing precursor, such as silanes, including silane ($SiH_4$), disilane ($Si_2H_6$), dichlorosilane ($SiH_2Cl_2$), hexachlorodisilane ($Si_2Cl_6$), dibromosilane ($SiH_2Br_2$), higher order silanes, derivatives thereof, and combinations thereof. Suitable germanium-containing precursors may include, but are not limited to germane ($GeH_4$), digermane ($Ge_2H_6$), trigermane ($GeSH_5$), chlorinated germane gas such as germanium tetrachloride ($GeCl_4$), dichlorogermane ($GeH_2Cl_2$), trichlorogermane ($GeHCl_3$), hexachloro-digermane ($Ge_2Cl_6$), or a combination of any two or more thereof. Any suitable halogenated germanium compounds may also be used. In one exemplary implementation, digermane ($Ge_2H_6$) is used.

In some embodiments, the epitaxial layer deposition process of block 840 includes a first selective epitaxial layer deposition process and an etch process. The selectivity in the first selective epitaxial layer deposition may arise from differences in nucleation of the third material on the p-MOS region 708 from that on the dielectric layer 710 (e.g., silicon dioxide ($SiO_2$) or silicon nitride ($Si_3N_4$)). The nucleation may occur at a faster rate on the surface of the source/drain region 758B of the p-MOS region 708 (e.g., silicon germanium (SiGe)) than on the dielectric layer 710, and thus an epitaxial layer of the third material may be formed selectively on the source/drain region 758B, while amorphous layers of the third material may be formed on the dielectric layer 710. In a subsequent etch process, the amorphous layers of the third material formed on the dielectric layer 710 can be etched at a faster rate than the epitaxial layer of the third material formed on the p-MOS region 708, by an appropriate etching gas. Thus, an overall result of the epitaxial deposition process and the etch process combined can be epitaxial growth of the third material on the source/drain region 758B, while minimizing growth, if any, of the third material on the dielectric layer 710.

Figure 9D:
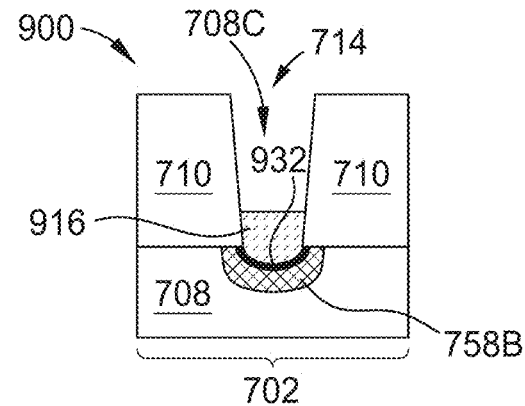

In block 850, a silicide forming process is performed to form a cavity contact 916 in the cavity 708C, as shown in FIG. 9D. The silicide forming process in block 850 is similar to or the same as the silicide forming process in block 630 or block 645.

Figure 9E:
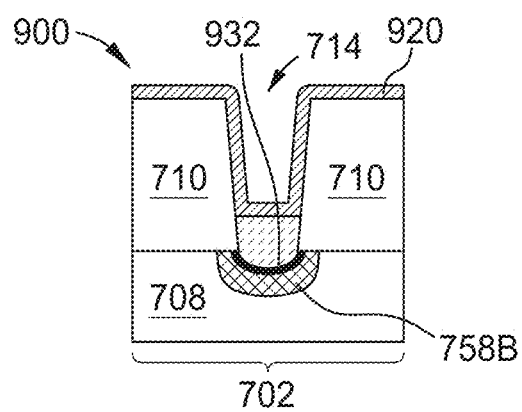

In block 860, a blanket deposition process is performed to form a barrier metal layer 920 on the exposed inner surfaces of the contact trench 714, and the exposed surface of the dielectric layer 710, as shown in FIG. 9E. The blanket deposition process in block 860 is similar to or the same as the blanket deposition process in block 650.

Figure 9F:
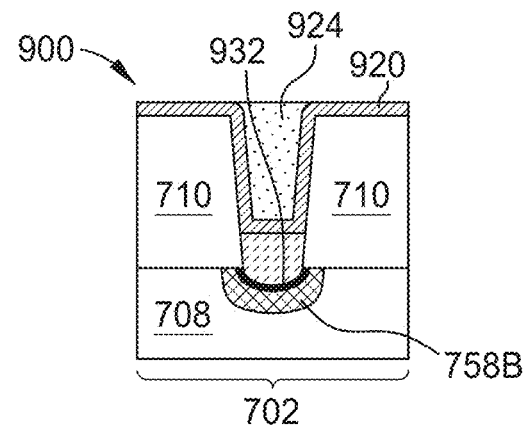

In block 870, a metal filling process is performed to form a contact plug 924 in the contact trench 714, as shown in FIG. 9F. After the metal filling process, the semiconductor structure 900 may be planarized, by use of a chemical mechanical planarization (CMP) process.

The embodiments described herein provide methods and system for forming an electrical contact. The methods include introducing metal dopants, such gallium (Ga), in an area where a cavity is formed by an isotropic etch process using hydrogen ($H_2$), chlorine ($Cl_2$), argon (Ar), and helium (He). Since the introduction of metal dopants can slow down an etch rate in certain direction, shape and location of the formed cavity can be engineered depending on the location and the size of a doped region. The location and the size of the doped region can be adjusted by a directional ion implantation process. The introduction of metal dopants, such as gallium (Ga), also reduces the contact resistivity between a MOS region and a contact plug within a contact trench.

In some embodiments of method 800 the process sequence can be repeated a second time to form the contact plug 924 over the source/drain region 758A of the n-MOS region 706 (e.g., silicon (Si)). In this process sequence, blocks 810 and 820 can be performed over the n-MOS region 706 to form an n-MOS cavity 706C thereover. During the performance of block 840 an epitaxial layer 932 is formed on the formed n-MOS cavity 706C. The deposited epitaxial layer 932 can include a silicon (Si) layer or a doped silicon containing layer, that includes a dopant such as an n-type dopant such as phosphorus (P), antimony (Sb), or arsenic (As). In some embodiments, the epitaxial layer deposition process of block 840 includes a first selective epitaxial layer deposition process and an etch process. The selectivity in the first selective epitaxial layer deposition may arise from differences in nucleation of the third material on the source/drain region 758A from that on the dielectric layer 710 (e.g., silicon dioxide ($SiO_2$) or silicon nitride ($Si_3N_4$)). Blocks 840-870 can then be performed over the n-MOS region 706 to form the contact plug 924. In some embodiments, block 850 can include the formation of metal silicide that includes, for example, a titanium silicide ($TiSi_x$), a cobalt silicide ($CoSi_x$), a zirconium silicide ($ZrSi_x$), a hafnium silicide ($HfSi_x$), and a nickel platinum silicide ($NiPtSi_x$).

While the foregoing is directed to embodiments of the present disclosure, other and further embodiments of the disclosure may be devised without departing from the basic scope thereof, and the scope thereof is determined by the claims that follow.

The invention claimed is:

1. A method of forming an electrical contact within a semiconductor device, comprising:
    performing a pre-clean process, wherein the pre-clean process comprises exposing surfaces of a substrate to a dry etch process comprising a hydrogen containing plasma;
    forming a contact cavity within a source/drain region of a semiconductor device structure formed on the substrate, wherein the source/drain region comprises a silicon germanium ($Si_xGe_{1-x}$) layer, and the forming of the contact cavity comprises:
        delivering a process gas to a processing region of a plasma processing chamber, wherein the process gas comprises hydrogen ($H_2$) gas, chlorine ($Cl_2$) gas, and one or more inert gases;
        delivering a radio frequency (RF) signal to a first electrode within the plasma processing chamber to form a plasma that comprises the process gas, wherein the plasma is formed over a surface of the semiconductor device structure of the substrate;
        biasing the substrate, while the plasma is formed, for a first period of time, wherein biasing the substrate comprises delivering a first bias signal to a second electrode disposed within a substrate support; and
        halting the biasing of the substrate, while the plasma is formed, for a second period of time, wherein the second period of time starts after the first period of time has elapsed,
    wherein a surface of the formed contact cavity comprises a portion of the silicon germanium ($Si_xGe_{1-x}$) layer; and
    selectively forming an epitaxial layer on the surface of the contact cavity by a first selective deposition process, wherein the epitaxial layer comprises silicon (Si) and germanium (Ge), wherein the first selective deposition process and the process of forming the contact cavity are performed in a processing system without breaking vacuum.

2. The method of claim 1, wherein forming the contact cavity further comprises:
    biasing the substrate, while the plasma is formed, for a third period of time after the first period of time has elapsed, wherein:
        biasing the substrate comprises delivering a second bias signal to the second electrode, and
        a magnitude of the second bias signal is less than a magnitude of the first bias signal.

3. The method of claim 2, wherein the magnitude of the second bias signal is equal to zero.

4. The method of claim 1, wherein
    delivering the process gas comprises delivering a first gas composition during the first period of time and delivering a second gas composition during the second period of time,
    the first gas composition comprises hydrogen ($H_2$) gas and the chlorine ($Cl_2$) gas at a gas flow rate ratio of between about 1:1 and 100:1, and
    the second gas composition comprises hydrogen ($H_2$) gas and the chlorine ($Cl_2$) gas at a gas flow rate ratio of between about 1:1 and 100:1.

5. The method of claim 1, wherein the one or more inert gases comprise argon (Ar) and helium (He).

6. The method of claim 1, wherein a temperature of the substrate is between $-100°$ C. and $200°$ C. while forming the contact cavity.

7. The method of claim 1, wherein the surface of the silicon germanium ($Si_xGe_{1-x}$) layer within the formed contact cavity comprises a (111) crystal plane.

8. The method of claim 7, wherein the silicon germanium ($Si_xGe_{1-x}$) layer further comprises a dopant, and X varies from about 0.5 to about 0.95.

9. The method of claim 1, further comprising:
    wherein the plasma comprises an inductively coupled plasma (ICP) generated at a first pressure between about 0.001 Torr and about 0.1 Torr during the first period of time and a second pressure greater than about 0.1 Torr during the second period of time.

10. The method of claim 1, further comprising:
    performing a pre-clean process after performing the contact cavity forming process, wherein the pre-clean process comprises exposing a surface of the contact cavity to a dry etch process comprising a hydrogen containing plasma.

11. The method of claim 1, wherein the silicon germanium ($Si_xGe_{1-x}$) layer of the source/drain region is positioned within a source/drain contact trench.

12. The method of claim 1, wherein
    the substrate comprises a first side and a second side,
    the semiconductor device structure is formed on the first side of the substrate, and
    the contact cavity is formed within the source/drain region within an opening formed on the second side of the substrate.

13. A method of forming an electrical contact within a semiconductor device, comprising:
    forming a first contact cavity within a source/drain region of a first semiconductor device structure formed on a substrate, wherein the source/drain region comprises a silicon germanium ($Si_xGe_{1-x}$) layer, and the forming of the first contact cavity comprises:
        delivering a first process gas to a processing region of a plasma processing chamber, wherein the first process gas comprises hydrogen ($H_2$) gas, chlorine ($Cl_2$) gas, and one or more inert gases;
        delivering a radio frequency (RF) signal to a first electrode within the plasma processing chamber to form a plasma that comprises the first process gas, wherein the plasma is formed over a surface of the first semiconductor device structure of the substrate;
        controlling a temperature of a substrate supporting surface of a substrate support to between about $-100°$ C. and about $200°$ C.; and
        biasing the substrate while the plasma is formed within the processing region,
    wherein:
        biasing the substrate comprises:
            delivering a first bias signal to a second electrode disposed within a substrate support for a first period of time; and
            delivering a second bias signal to the second electrode for a second period of time, wherein a magnitude of the second bias signal is less than a magnitude of the first bias signal, a surface of the formed first contact cavity comprises a portion of the silicon germanium ($Si_xGe_{1-x}$) layer, delivering the first process gas comprises delivering a first gas composition during the first period of time and delivering a second gas composition during the second period of time, the first gas composition comprises hydrogen ($H_2$) gas and the chlorine ($Cl_2$) gas at a gas flow rate ratio of between about 1:1 and 100:1, and the second gas composition comprises hydrogen ($H_2$) gas and the chlorine ($Cl_2$) gas at a gas flow rate ratio of between about 1:1 and 100:1.

14. The method of claim 13, wherein the plasma comprises an inductively coupled plasma (ICP) generated at a pressure between about 1 Torr and about 50 Torr.

15. The method of claim 14, wherein the first process gas comprises a hydrogen ($H_2$) gas to chlorine ($Cl_2$) gas flowrate ratio of about 2:1 to 20:1.

16. The method of claim 13, further comprising:
forming a second contact cavity within a source/drain region of a second semiconductor device structure formed on the substrate, wherein the source/drain region comprises silicon (Si) and a dopant, and the forming of the second contact cavity comprises:
delivering a second process gas to a processing region of a plasma processing chamber, wherein the second process gas comprises hydrogen ($H_2$), chlorine ($Cl_2$) and one or more inert gases;
delivering a radio frequency (RF) signal to the first electrode to form a plasma that comprises the second process gas, wherein the plasma is formed over the surface of the second semiconductor device structure of the substrate;
controlling the temperature of the substrate supporting surface of the substrate support to between about −100° C. and about 200° C.; and
biasing the substrate while the plasma is formed within the processing region, wherein biasing the substrate comprises delivering a third substrate-bias signal to the second electrode disposed within the substrate support for a third period of time.

17. The method of claim 13, further comprising forming:
selectively forming an epitaxial layer on the surface of the formed first contact cavity by a first selective deposition process, wherein the epitaxial layer comprises silicon (Si) and germanium (Ge).

18. A method of forming an electrical contact within a semiconductor device, comprising:
forming a contact cavity within a semiconductor material region of a semiconductor device structure formed on a substrate, wherein forming of the contact cavity comprises:
delivering a process gas to a processing region of a plasma processing chamber, wherein the process gas comprises hydrogen ($H_2$) gas, chlorine ($Cl_2$) gas, and one or more inert gases;
delivering a radio frequency (RF) signal to a first electrode within the plasma processing chamber to form a plasma that comprises the process gas, wherein the plasma is formed over a surface of the semiconductor device structure of the substrate;
biasing the substrate, while the plasma is formed, for a first period of time, wherein biasing the substrate comprises delivering a first bias signal to a second electrode disposed within a substrate support; and halting the biasing of the substrate, while the plasma is formed, for a second period of time, wherein the second period of time starts after the first period of time has elapsed, wherein:
the plasma comprises an inductively coupled plasma (ICP) generated at a first pressure between about 0.001 Torr and about 0.1 Torr during the first period of time and a second pressure greater than about 0.1 Torr during the second period of time, and
a surface of the formed contact cavity comprises a portion of the semiconductor material region.

19. The method of claim 18, wherein forming the contact cavity further comprises:
biasing the substrate, while the plasma is formed, for a second period of time after the first period of time has elapsed, wherein
biasing the substrate comprises delivering a second bias signal to the second electrode, and
a magnitude of the bias signal is less than a magnitude of the first bias signal.

20. The method of claim 19, wherein the magnitude of the second bias signal is equal to zero.

21. The method of claim 18, wherein
delivering the process gas comprises delivering a first gas composition provided during the first period of time and delivering a second gas composition during the second period of time,
the first gas composition comprises hydrogen ($H_2$) gas and the chlorine containing gas comprises chlorine ($Cl_2$) gas at a gas flow rate ratio of between about 1:1 and 100:1, and
the second gas composition comprises hydrogen ($H_2$) gas and the chlorine ($Cl_2$) gas at a gas flow rate ratio of between about 1:1 and 100:1.

22. The method of claim 18, wherein the one or more inert gases comprise argon (Ar) and helium (He).

23. The method of claim 18, wherein the semiconductor material region comprises silicon germanium ($Si_xGe_{1-x}$), wherein X varies from about 0.5 to about 0.95.

24. The method of claim 18, wherein
the substrate comprises a first side and a second side,
the semiconductor device structure is formed on the first side of the substrate, and
the contact cavity is formed within the semiconductor material region within an opening formed on the second side of the substrate.

25. A method of forming an electrical contact within a semiconductor device, comprising:
forming a first contact cavity within a semiconductor material region of a first semiconductor device structure formed on a substrate, wherein forming of the first contact cavity comprises:
delivering a first process gas to a processing region of a plasma processing chamber, wherein the first process gas comprises hydrogen ($H_2$), chlorine ($Cl_2$) and one or more inert gases;
delivering a first radio frequency (RF) signal to a first electrode within the plasma processing chamber to form a plasma that comprises the first process gas, wherein the plasma is formed over a surface of the first semiconductor device structure of the substrate;
controlling a temperature of a substrate supporting surface of a substrate support to between about −100° C. and about 200° C.; and
biasing the substrate while the plasma is formed within the processing region, wherein:
  biasing the substrate comprises:
    delivering a first bias signal to a second electrode disposed within a substrate support for a first period of time; and
    delivering a second bias signal to the second electrode for a second period of time, wherein a magnitude of the second bias signal is less than a magnitude of the first bias signal,
  a surface of the formed first contact cavity comprises a portion of the semiconductor material region,
  delivering the first process gas comprises delivering a first gas composition during the first period of time and delivering a second gas composition during the second period of time,
  the first gas composition comprises hydrogen ($H_2$) gas and the chlorine ($Cl_2$) gas at a gas flow rate ratio of between about 1:1 and 100:1, and
the second gas composition comprises hydrogen ($H_2$) gas and the chlorine ($Cl_2$) gas at a gas flow rate ratio of between about 1:1 and 100:1.

26. The method of claim 25, further comprising:
forming a second contact cavity within a semiconductor material region of a second semiconductor device structure formed on the substrate, wherein forming of the second contact cavity comprises:
  delivering a second process gas to the processing region of the plasma processing chamber, wherein the second process gas comprises hydrogen ($H_2$), chlorine ($Cl_2$) and one or more inert gases;
  delivering a second radio frequency (RF) signal to the first electrode to form a plasma that comprises the second process gas, wherein the plasma is formed over the surface of the second semiconductor device structure of the substrate;
  controlling the temperature of the substrate supporting surface of the substrate support to between about −100° C. and about 200° C.; and
  biasing the substrate while the plasma is formed within the processing region, wherein biasing the substrate comprises delivering a third substrate bias signal to the second electrode disposed within the substrate support for a third period of time.

* * * * *